US011375645B2

(12) United States Patent
Cho et al.

(10) Patent No.: US 11,375,645 B2
(45) Date of Patent: Jun. 28, 2022

(54) POWER MODULE AND MANUFACTURING METHOD THEREFOR, AND INVERTER APPARATUS HAVING POWER MODULE

(71) Applicant: LG Electronics Inc., Seoul (KR)

(72) Inventors: Namjoon Cho, Seoul (KR); Taejin Kim, Seoul (KR); Gilsu Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 17/052,992

(22) PCT Filed: Nov. 21, 2018

(86) PCT No.: PCT/KR2018/014343
§ 371 (c)(1),
(2) Date: Nov. 4, 2020

(87) PCT Pub. No.: WO2020/101091
PCT Pub. Date: May 22, 2020

(65) Prior Publication Data
US 2021/0274690 A1    Sep. 2, 2021

(30) Foreign Application Priority Data

Nov. 14, 2018 (KR) .................. 10-2018-0140076

(51) Int. Cl.
*H05K 7/20* (2006.01)
*H01L 23/473* (2006.01)
*H02M 7/44* (2006.01)

(52) U.S. Cl.
CPC ....... *H05K 7/20927* (2013.01); *H01L 23/473* (2013.01); *H02M 7/44* (2013.01); *H05K 7/209* (2013.01); *H05K 7/20272* (2013.01)

(58) Field of Classification Search
CPC ............. H05K 7/20927; H05K 7/2089; H05K 7/1432; H05K 7/209; H05K 7/20272; H05K 7/20; H05K 7/20872; H05K 7/20809; H01L 23/473; H02M 7/00; H02M 7/003; H02M 7/44
See application file for complete search history.

(56) References Cited

U.S. PATENT DOCUMENTS

2003/0133267 A1* 7/2003 Beihoff .............. H05K 7/20927
361/704
2004/0062004 A1* 4/2004 Pfeifer .................. H02M 7/003
361/699

(Continued)

FOREIGN PATENT DOCUMENTS

JP    2010087002    4/2010
JP    2014110286    6/2014

(Continued)

*Primary Examiner* — Adam B Dravininkas
(74) *Attorney, Agent, or Firm* — Fish & Richardson P.C.

(57) ABSTRACT

A power module of the present invention includes a power device for converting and outputting a frequency of an input power source, and a housing accommodating the power device therein and forming flow paths for a cooling fluid on both sides of the power device such that the cooling fluid can contact both sides of the power device. Accordingly, both plate surfaces of the power device can be in direct contact with the cooling fluid so as to be quickly cooled.

17 Claims, 17 Drawing Sheets

(56) References Cited

U.S. PATENT DOCUMENTS

| | | | |
|---|---|---|---|
| 2005/0152101 A1* | 7/2005 | Rodriguez | H02M 7/003 361/605 |
| 2007/0252169 A1* | 11/2007 | Tokuyama | H02M 7/003 257/162 |
| 2008/0130223 A1* | 6/2008 | Nakamura | H02M 7/003 361/689 |
| 2008/0224303 A1* | 9/2008 | Funakoshi | H01L 23/051 257/701 |
| 2009/0040724 A1* | 2/2009 | Nishikimi | H02M 7/5387 361/699 |
| 2009/0284921 A1 | 11/2009 | Colgan et al. | |
| 2011/0051371 A1* | 3/2011 | Azuma | H02M 7/003 361/699 |
| 2012/0275205 A1* | 11/2012 | Nakatsu | H05K 7/02 363/141 |
| 2015/0235930 A1 | 8/2015 | Ewanchuk et al. | |
| 2015/0349656 A1* | 12/2015 | Tokuyama | H01L 23/3121 363/132 |

FOREIGN PATENT DOCUMENTS

| | | |
|---|---|---|
| KR | 100767325 | 10/2007 |
| KR | 20080096806 | 11/2008 |
| KR | 20100126087 | 12/2010 |
| KR | 20170055605 | 5/2017 |
| KR | 101800048 | 11/2017 |

\* cited by examiner

POWER MODULE AND MANUFACTURING METHOD THEREFOR, AND INVERTER APPARATUS HAVING POWER MODULE

CROSS-REFERENCE TO RELATED APPLICATIONS

This application is a National Stage application under 35 U.S.C. § 371 of International Application No. PCT/KR2018/014343, filed on Nov. 21, 2018, which claims the benefit of Korean Application No. 10-2018-0140076, filed on Nov. 14, 2018. The disclosures of the prior applications are incorporated by reference in their entirety.

TECHNICAL FIELD

The present disclosure relates to a power module and a manufacturing method therefor, and an inverter apparatus having a power module.

BACKGROUND ART

As is well known, a power device or a power semiconductor device (hereinafter referred to as a power device) is a semiconductor device for power devices, such as a rectification diode, a power metal oxide semiconductor field effect transistor (MOSFET), an insulated gate bipolar transistor (IGBT), a thyristor, a gate turn-off thyristor (GTO), a triode AC switch (TRIAC), etc.

An inverter that controls a rotational speed of a motor is configured to include the power device to convert a frequency of a power source.

The power device is provided with a cooling device to prevent performance degradation due to high temperature caused by a great amount of heat generated during an operation.

The power device is usually implemented in a rectangular parallelepiped shape, and a heat dissipating device called a heat sink is provided on a surface of the power device for cooling.

A heat transferring material called a thermal interface material (TIM) may be inserted between the surface of the power device and the heat dissipating device so that an air layer, which is an insulating material, can be reduced.

The heat sink may be naturally cooled by surrounding air, or forcibly cooled by a cooling fan around the heat sink to facilitate a movement of air.

In addition, in some inverters, a flow path of cooling fluid may be provided at one side of the heat sink to allow heat exchange with the cooling fluid (cooling water) in a liquid state.

In addition, in other inverters, a method for cooling the power device by a phase changeable refrigerant in a refrigeration cycle is used.

Meanwhile, normally the power device is connected to a gate board provided with a control circuit to control an input power source.

However, in an inverter provided with the related art power device, an amount of heat increases as a switching speed of the power device increases, and a method for attaching a cooling device onto one surface of the power device has a limit in reducing a surface temperature of the power device when the power device is configured to perform a high-speed switching.

In addition, since the thermal interface material inserted to remove the air layer between the power device and the cooling device has a significantly higher heat resistance than a metal and thereby significantly lowering a heat transfer speed than that of the metal, there is a limitation in cooling the surface temperature of the of the power device.

In addition, it is difficult to apply a method of directly cooling the power device with a conductive cooling fluid because of a fear of damage such as short circuits. With this reason, indirect cooling method through a thermal interface material is applied, and thus a size of a cooling component for cooling is increased, and a size of the inverter increases as much.

In particular, for an inverter used in a vehicle, a size of the vehicle (engine room) is very limited, so when a size (height) of an inverter case is increased, it may be difficult to install the inverter case if the size of the engine room of the vehicle is not increased.

In addition, in the inverter having the related art power device, as the gate board connected to the power device is naturally cooled by air inside the inverter case and the inverter case is maintained to be sealed for water injection insulation, a flow of air inside the case becomes weak. With this reason, cooling of the power device mounted on the gate board is insufficient.

In particular, since a pin-fin structure cannot be directly applied to the power device mounted on the gate board due to its structure, an indirect cooling method through a thermal interface material (TIM) is applied, and therefore insufficient cooling is performed.

When cooling of the power device of the gate board is insufficient, there is a problem that a performance of the power device may be deteriorated due to an increase in thermal resistance cause by high temperature.

PRIOR ART DOCUMENT

Patent Document (Patent Document 1) KR10-0767325 B1
(Patent Document 2) KR10-2008-0096806 A
(Patent Document 3) KR10-1800048 B1
(Patent Document 4) KR10-2017-0055605 A

DETAILED DESCRIPTION OF THE DISCLOSURE

Technical Problem

Accordingly, an aspect of the present disclosure is to provide a power module capable of cooling both plate surfaces of a power device at the same time, a manufacturing method therefor, and an inverter apparatus having a power device.

Another aspect of the present disclosure is to provide a power module capable of directly cooling a power device without mediating a thermal interface material, a manufacturing method therefor, and an inverter apparatus having a power device.

In addition, still another aspect of the present disclosure is to provide a power module in which a height thereof can be lowered, a manufacturing method therefor, and an inverter apparatus having a power device.

In addition, still another aspect of the present disclosure is to provide a power module capable of facilitating cooling of a gate board, a manufacturing method therefor, and an inverter apparatus having a power device.

Technical Solution

In order to achieve the aspects of the present disclosure, there is provided with a power module including a power device for converting and outputting a frequency of an input power source, and a housing accommodating the power device therein and forming flow paths for a cooling fluid on both sides of the power device such that the cooling fluid can contact the both sides of the power device.

According to an embodiment of the present disclosure, the power device includes a circuit element assembly provided with a plurality of circuit elements having a plurality of terminals and constituting a circuit, and a coating layer formed to surround a periphery of the circuit element assembly such that end portions of the plurality of terminals are externally exposed.

According to an embodiment of the present disclosure, the plurality of terminals are provided with an input terminal protruding outward of one side surface of the housing and an output terminal protruding outward of another side surface of the housing.

According to an embodiment of the present disclosure, the input terminal and the output terminal are provided on opposite side surfaces of the housing, respectively.

According to an embodiment of the present disclosure, the power device further includes cooling fins each having one side thereof connected to the circuit element assembly and another side thereof protruding outward of the coating layer to exchange heat with the cooling fluid by a contact between the cooling fluid and the cooling fins.

According to an embodiment of the present disclosure, the power device is provided with a plurality of zones in which surface temperatures are in different temperature ranges, and a greater number of the cooling fins are provided in a zone having a relatively higher temperature among the plurality of zones.

According to an embodiment of the present disclosure, the power device is provided with a plurality of zones in which surface temperatures are in different temperature ranges, and the cooling fins are disposed closer to each other in a zone having a relatively higher temperature than in a zone having a relatively lower temperature, so that a flow rate of the cooling fluid in the zone having the zone having a relatively higher temperature among the plurality of zones is increased.

According to an embodiment of the present disclosure, the plurality of terminals further includes communication pins each having one side thereof connected to the circuit element assembly and another side thereof protruding outward of the housing, and further includes a gate board provided with a control circuits configured to control the input power source of the power device, and connected to the communication pins.

According to an embodiment of the present disclosure, the housing includes a first housing having an upwardly opened accommodating space therein, and a second housing coupled to block an upper opening of the first housing.

According to an embodiment of the present disclosure, the gate board is provided with a high-temperature element having a relatively large amount of heat, and configured such that the high-temperature element is disposed to face the second housing.

According to an embodiment of the present disclosure, the second housing is provided with high-temperature element contact portion that is in heat exchangeable contact with the high-temperature element.

According to an embodiment of the present disclosure, it is preferable that the high-temperature element contact portion is made of a metal member.

According to an embodiment of the present disclosure, the second housing is made of a metal member.

According to an embodiment of the present disclosure, the high-temperature element is provided in plural each having a height different from each other, and the second housing is made of a metal member and is provided with high-temperature element contact portions each having a height different from each other so as to be brought into contact with each of the plurality of high-temperature elements.

According to an embodiment of the present disclosure, an area where the first housing and the second housing are contacting each other is provided with engaging portions engaged with each other in a thickness direction.

According to an embodiment of the present disclosure, the engaging portions each includes a coupling protrusion protruding in the thickness direction from one of the first housing and the second housing, and a coupling protrusion coupling portion configured to be engaged with the coupling protrusion, and provided on another one of the first housing and the second housing.

According to an embodiment of the present disclosure, the housing is provided with an inlet portion through which the cooling fluid flows in and an outlet portion through which the cooling fluid flows out.

According to an embodiment of the present disclosure, the inlet portion is formed at one end portion in a lengthwise direction of the housing, and the outlet portion is formed at another end portion in the lengthwise direction of the housing.

According to an embodiment of the present disclosure, the inlet portion is formed to protrude obliquely to one side with respect to a lengthwise direction at one end portion in the lengthwise direction of the housing, and the inlet portion is formed to protrude obliquely to another side with respect to the lengthwise direction at the one end portion in the lengthwise direction of the housing.

According to an embodiment of the present disclosure, a communication portion configured to allow the flow paths for the cooling fluid provided inside the housing to communicate with each other is formed at another end portion in the lengthwise direction of the housing.

According to an embodiment of the present disclosure, the housing is provided with a partition portion configured to partition an inner space of the housing.

Meanwhile, according to another aspect of the present disclosure, there is provided a method for manufacturing a power module, the method including preparing a power device for converting and outputting a frequency of an input power source, and preparing a housing accommodating the power device therein and forming flow paths for a cooling fluid on both sides of the power device such that the cooling fluid can contact the both sides of the power device.

According to an embodiment of the present disclosure, the preparing the power device includes forming a circuit element assembly by connecting a plurality of circuit elements having a plurality of terminals and constituting a circuit, and forming a coating layer to surround the circuit element assembly with end portions of the plurality of terminals being externally exposed.

According to an embodiment of the present disclosure, the preparing the housing includes preparing a first housing having an upwardly opened accommodating space therein at a periphery of the power device, preparing a second housing coupled to block an upper opening of the first housing, and coupling the second housing to the first housing.

According to an embodiment of the present disclosure, the method further includes connecting a gate board provided with a circuit configured to control the input power source of the power device, after the preparing the housing.

According to an embodiment of the present disclosure, the gate board is provided with high-temperature elements having a relatively large amount of heat. Prior to the connecting the gate board, the preparing the first housing includes forming high-temperature element contact portions that are in heat exchangeable contact with the high-temperature elements of the gate board, and the connecting the gate board further includes arranging the gate board in a manner that the high-temperature element contact portions and the high-temperature elements are brought into contact with each other.

In addition, according to still another aspect of the present disclosure, there is provided an inverter apparatus having a power module including a case, a power module disposed inside the case and including a power device for converting and outputting a frequency of an input power source and a housing accommodating the power device therein and forming flow paths for a cooling fluid on both sides of the power device such that the cooling fluid can contact the both sides of the power device, and a direct current (DC) link capacitor disposed inside the case and providing a direct current power source to the power module.

According to an embodiment of the present disclosure, the power device includes a circuit element assembly having a plurality of terminals and a plurality of circuit elements constituting a circuit, a coating layer formed to surround a periphery of the circuit element assembly, and a plurality of fins each having one side thereof connected to the circuit element assembly and another side thereof protruding outward of the coating layer. Wherein the plurality of terminals includes input terminals each having one side thereof connected to the circuit element assembly and another side thereof protruding outward of one side surface of the housing so as to be connected to the DC link capacitor.

According to an embodiment of the present disclosure, the plurality of terminals further includes output terminals each protruding outward of another side surface, that is opposite to the one side surface, of the housing.

According to an embodiment of the present disclosure, the plurality of terminals further includes communication pins each protruding outward of a side surface portion of the housing and bent upward, and further includes a gate board connected to the communication pins and provided with control circuits configured to control the input power source of the power device. Wherein the gate board is provided with high-temperature elements, and the high-temperature elements are disposed to contact the housing.

According to an embodiment of the present disclosure, the inverter apparatus having the power module further includes a control board connected to the gate board to control a switching waveform of the power device, and further includes an insulating member provided between the gate board and the case or between the control board and the case.

Advantageous Effects

As described above, according to an embodiment of the present disclosure, cooling fluid (cooling water) exchanges heat by directly contacting both sides of the power device, so that cooling of the power device can be significantly facilitated.

In addition, since the cooling fluid (cooling water) exchanges heat by directly contacting the both sides of the power device, and therefore a use of thermal interface materials that have significantly greater thermal resistance compared to a heat sink and a metal inserted between the heat sink and the power device can be excluded, cooling rate of the power device can be remarkably increased.

In addition, by arranging an input terminal and an output terminal, through which a power source of a power device is inputted and outputted, on opposite side surfaces of a housing, a length of an input cable connected to the input terminal and a length of an output cable connected to the output terminal can be shortened.

In addition, the power device is configured to include a plurality of circuit elements, a coating layer surrounding the plurality of circuit elements, and cooling fins each having one side thereof connected to the plurality of circuit elements and another side thereof protruding outward of the coating layer to contact the cooling fluid. With this configuration, cooling of the plurality of circuit elements can be facilitated.

Further, by disposing more cooling fins on surfaces of a plurality of circuit elements having a relatively large amount of heat than on surfaces of another plurality of circuit elements in the power device, an occurrence of temperature variation on a surface of the power device can be suppressed.

In addition, by disposing the cooling fins on the surfaces of the circuit elements having the relatively large amount of heat closer to each other than the cooling fins on surfaces of the circuit elements having a relatively small amount of heat, a flow rate of a cooling fluid on the surface of the circuit elements having the relatively large amount of heat is increased to facilitate cooling.

In addition, by configuring the housing to include a first housing and a second housing that are coupled to each other to form a flow path therein, and by forming the second housing of a metal member, a use of an electro-magnetic interference (EMI) shielding plate can be eliminated.

In addition, by configuring the high-temperature elements of the gate board to be brought into contact with the housing to allow a direct heat exchange, cooling of the high-temperature elements of the gate board can be remarkably increased.

In addition, by including high-temperature element contact portions in contact with the high-temperature elements of the gate board in the housing, the high-temperature elements of the gate board can be effectively cooled.

In addition, by configuring the housing to include the first housing and the second housing to be coupled to each other, and the first housing and the second housing to have engaging portions, a use of fixing members (bolts or screws) for coupling the first housing and the second housing can be excluded.

Accordingly, a space for arranging the fins of the power device is secured, so that the fins can be easily arranged.

In addition, by configuring an inlet portion through which cooling fluid flows in and an outlet portion through which cooling fluid flows out at one end portion of the housing, the cooling fluid reciprocates inside the housing, and thereby uniformly cooling the power device in the housing.

In addition, by providing a partition portion for partitioning an inner space in the housing, the cooling fluid can be evenly cooled by changing a direction of flow.

In addition, by providing the partition portion for partitioning the inner space in the housing, a flow path for a cooling fluid inside the housing is extended and a heat exchange (time) between the cooling fluid and the power device is increased, and thus a cooling effect of the power device is remarkably increased.

In addition, by interposing an insulating member between the gate board and/or the control board and the case of the inverter, a spaced distance (creeping distance) for insulation between the gate board and/or control board and the case of the inverter can be reduced. Therefore, a floor area of the case of the inverter can be reduced.

MODES FOR CARRYING OUT PREFERRED EMBODIMENTS

Hereinafter, embodiments of the present disclosure will be described in detail with reference to the accompanying drawings. For the sake of brief description with reference to the drawings, the same or equivalent components will be provided with the same reference numbers, and description thereof will not be repeated. A singular representation may include a plural representation unless it represents a definitely different meaning from the context. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

Figure 1:
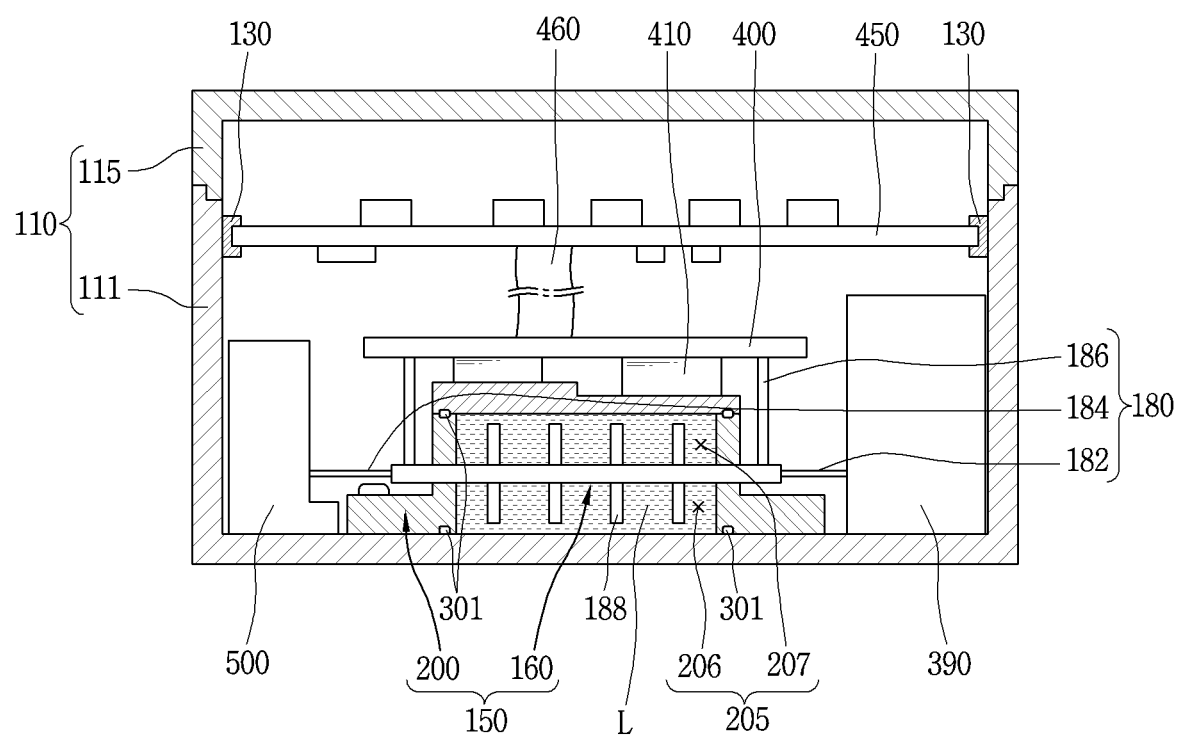
FIG. 1 is a sectional view of an inverter apparatus having a power module in accordance with one embodiment of the present disclosure.

FIG. 1 is a sectional view of an inverter apparatus having a power module in accordance with one embodiment of the present disclosure. As illustrated in FIG. 1, the inverter apparatus having the power module in accordance with one embodiment of the present disclosure includes a case 110, a power module 150, and a direct current (DC) link capacitor 390.

The case 110 has an accommodating space formed therein, and is implemented in a substantially rectangular parallelepiped shape. The case 110 includes, for example, a case body 111 upwardly opened and a case cover 115 configured to open and close an upper opening of the case body 111. The case body 111 and the case cover 115 may be configured to be sealable so that water injection insulation is possible when, for example, mutually coupled.

The power module 150 is provided inside the case 110. The power module 150 includes a power device (power semiconductor) 160 and a housing. The DC link capacitor 390 is provided on one side (input side) of the power module 150 to provide a direct current power source to the power module 150. A gate board 400 is provided above the power module 150. A control board 450 is provided above the gate board 400. The gate board 400 and the control board 450 may be connected to each other through a communication line 460 to enable communication. The communication line 460 may be implemented as, for example, a cable or a flexible printed circuit board (PCB). Another side (output side) of the power module 150 is provided with a detection sensor 500 configured to detect an output power source.

Figure 2:
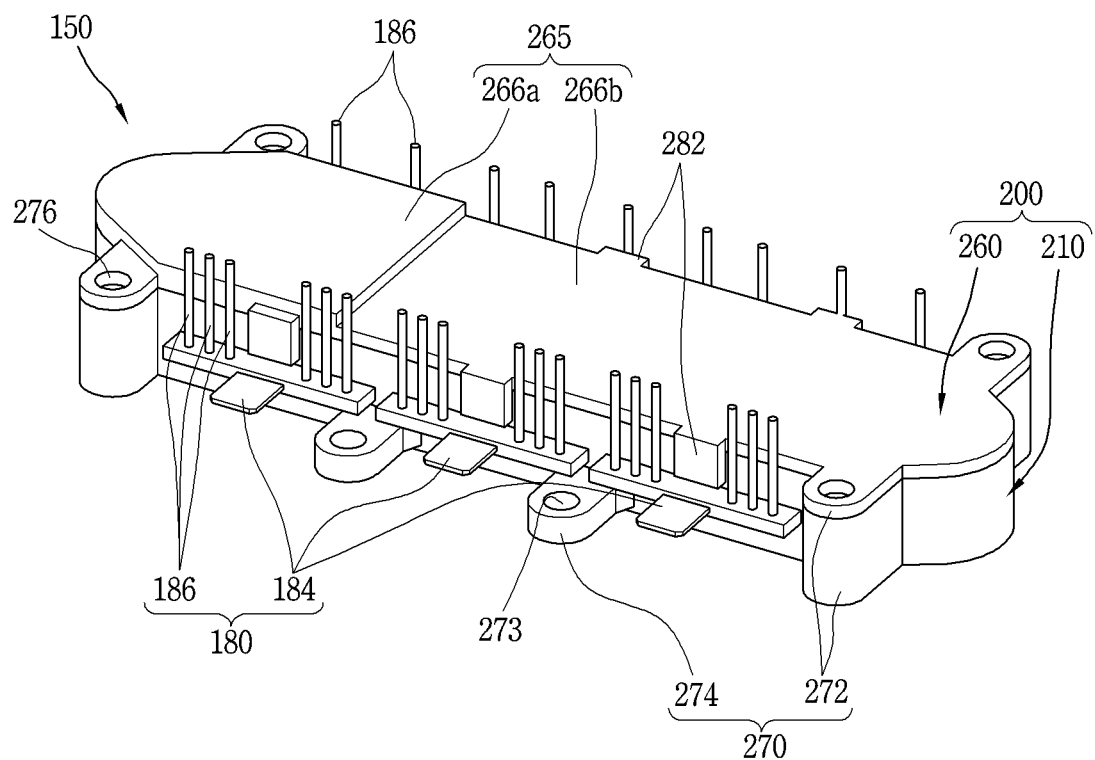
FIG. 2 is a perspective view illustrating a power module of FIG. 1.
Figure 3:
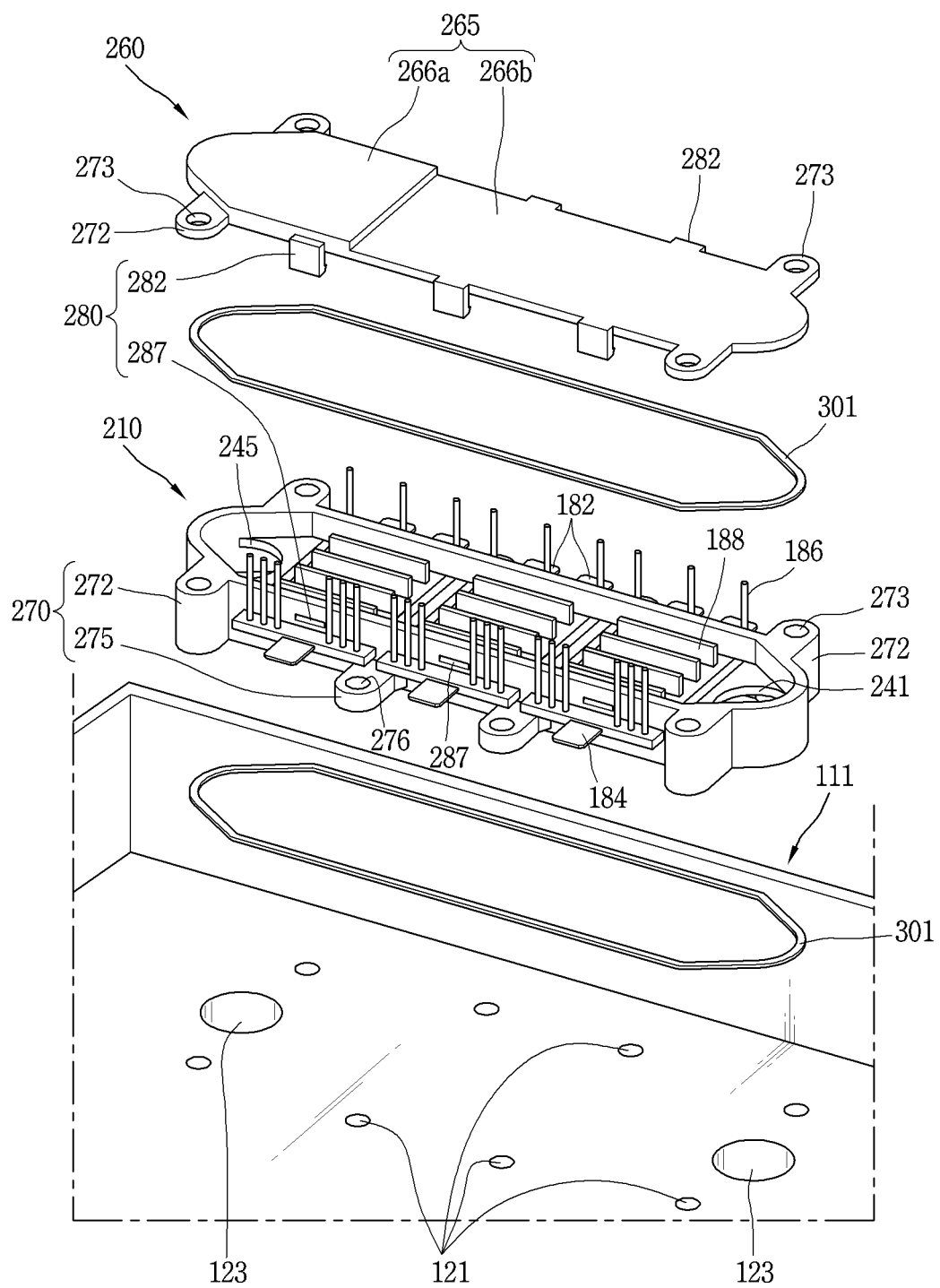
FIG. 3 is an exploded perspective view of a region of a power module of FIG. 1.

FIG. 2 is a perspective view illustrating the power module of FIG. 1, and FIG. 3 is an exploded perspective view of a region of the power module of FIG. 1. As illustrated in FIGS. 2 and 3, the power module 150 includes the power device 160 for converting and outputting a frequency of an input power source, and a housing 200 accommodating the power device 160 therein and forming flow paths 205 for a cooling fluid L on both sides of the power device 160 such that cooling fluid L can contact the both sides of the power device.

The housing 200 may be implemented in, for example, a rectangular parallelepiped shape having a thickness that is smaller than a width thereof. The housing 200 includes, for example, a first housing 210 and a second housing 260 coupled to each other in a thickness direction. The housing may be formed of, for example, synthetic resin. The housing 200 is provided with an inlet portion 241 through which cooling fluid L flows in and an outlet portion 245 through which cooling fluid L flows out. The inlet portion 241 may be formed at one end portion in a lengthwise direction of the housing 200, and the outlet portion 245 may be formed at another end in the lengthwise direction of the housing 200. Both end portions (short side portions) of the housing 200 may have protrusions 235 that protrude convexly outward in the lengthwise direction, respectively. The inlet portion 241 and the outlet portion 245 may be formed in each of the protrusions 235.

The first housing 210 may be formed of, for example, synthetic resin. The first housing 210 may have an upwardly opened accommodating space therein. The second housing 260 may be formed in a plate shape to open and close an upper opening of the first housing 210, for example.

The second housing 260 may be formed of, for example, a metal member. The second housing 260 may be formed of, for example, an aluminum member. Accordingly, a use of an electro-magnetic interference (EMI) shielding plate that shields a noise from being introduced into the housing 200 may be eliminated.

The first housing 210 may have flow paths 205 for cooling fluid L formed at both sides (upper side and lower side in the drawing) of the power device 160, respectively. Accordingly, the housing 200 may be provided with the power device 160 at an inner intermediate point (height) in a thickness direction, and may have a thickness that is sufficient for forming the flow paths 205 for cooling fluid L at an upper side and a lower side of the power device 160, respectively. The first housing 210 may be formed to be vertically opened, for example. A lower surface of the first housing 210 may be configured to contact the case 110. Accordingly, a lower opening of the housing 200 may be blocked by the case 110. Airtight members 301 may be provided at an upper end portion and a lower end portion of the first housing 210, respectively. Accordingly, leakage of cooling fluid L inside the housing 200 can be prevented.

The airtight members 301 may be formed of, for example, a rubber member. The airtight members 301 may be implemented in a closed loop shape corresponding to a circumference of the first housing 210. The airtight members 301 may have a long oval ring shape. The airtight members 301 may be formed in a closed loop shape corresponding to a shape of an upper end surface and a shape of a lower end surface of the first housing 201, respectively. More specifically, the airtight members 301 may be inserted between the lower end surface of the first housing 210 and a lower end surface of the case 110. As a result, a gap between the first housing 210 and the case 110 is blocked, and accordingly, a leakage of cooling fluid L can be prevented. The airtight members 301 may be inserted between the upper end surface of the first housing 210 and the second housing 260. As a result, a gap between the first housing 210 and the second housing 260 is blocked, and accordingly, a leakage of cooling fluid L can be prevented.

Coupling portions 270 may be provided in the housing 200 so as to be coupled to the case 110 of the inverter. Each of the coupling portions 270 may be configured to protrude outward from the housing 200, for example. The coupling portion 270 may include first coupling portions 272 provided at each corner region of the housing 200. The coupling portion 270 may include second coupling portions 275 provided at a central region of the housing 200.

The first coupling portions 272 may be provided at each corner of the first housing 210 and at each corner of the second housing 260, respectively. Through holes 273 may be formed through each of the first coupling portions 272, so that fixing members are inserted therethrough. The second coupling portions 275 may be formed at central regions of both long side portions of the second housing 260, respectively. Each of the second coupling portions 275 may have a through hole 276, so that a fixing member is inserted therethrough. The first coupling portion 272 of the first housing 210 may be configured to have a thickness thicker than a thickness of the second coupling portion 275 so that the first coupling portion 272 of the first housing 210 and the first coupling portion 272 of the second housing 260 contact each other. In this embodiment, four first coupling portions 272 and four second coupling portions 275 are provided.

However, this is merely an example, and the number may be appropriately adjusted. Here, since the second housing 260 is not provided with the second coupling portion 275, utilization of side space of the second housing 260 can be increased.

The case 110 may be provided with fixing member coupling portions 121 so that fixing members (e.g., bolts or screws) passed through the coupling portions 270 of the housing 200 may be coupled thereto. The fixing member coupling portion 121 may be provided with, for example, a female screw portion so as to be screwed to a male screw portion of the fixing member. Communication holes 123 may be formed through the case 110 to communicate with the inlet portion 241 and the outlet portion 245, respectively. To the communication holes 123, connection pipes 125 connected to the circulation flow path of cooling fluid L may be connected, respectively. A cooling unit (not illustrated) configured to cool a cooling fluid L may be provided in the circulation flow path of cooling fluid L. More specifically, the inverter apparatus may be provided in a vehicle, and the cooling fluid L may be a cooling water of the vehicle. The cooling unit may be, for example, a radiator of the vehicle.

On the other hand, the first housing 210 and the second housing 260 may be provided with engaging portions 280 so that the first housing 210 and the second housing 260 are engaged with each other in the thickness direction.

Figure 4:
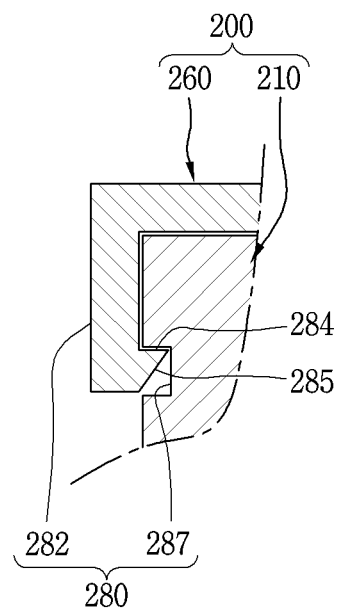
FIG. 4 is a sectional view of a region of engaging portions of FIG. 2.

FIG. 4 is a sectional view of a region of the engaging portions of FIG. 2. As illustrated in FIG. 4, the engaging portions 280 are configured to include coupling protrusions 282 protruding in the thickness direction from one of the first housing 210 and the second housing 260, and coupling protrusion coupling portions 287 formed to be engaged with the coupling protrusions 282, and provided on another one of the first housing 210 and the second housing 260. The coupling protrusions 282 may be formed at the second housing 260. The plurality of coupling protrusions 282 protruding downward in the thickness direction is formed at both sides (both long side portions) of the second housing 260, respectively.

In an inner end region of each of the coupling protrusions 282, a locking protrusion 284 may be formed to protrude inward (a widthwise direction of the housing 200). An inclined guide inclined surface 285 may be formed at an end portion of each of the coupling protrusions 282. Each of the coupling protrusion coupling portions 287 recessed inward to correspond to each of the coupling protrusions 282 may be formed at both sides (both long side portions) of the first housing 210. The coupling protrusion coupling portions 287 may be formed to be recessed so that the locking protrusions 284 of the coupling protrusions 282 are coupled therein. As a result, when the locking protrusion 284 is introduced into the coupling protrusion coupling portion 287, the locking protrusion 284 is brought into contact with one side surface (an upper surface in the drawing) of the coupling protrusion coupling portion 287 so as to be engaged with the coupling protrusion coupling portion 287 in the thickness direction. Thus, the second housing 260 may be prevented from being accidentally separated from the first housing 210.

Figure 5:
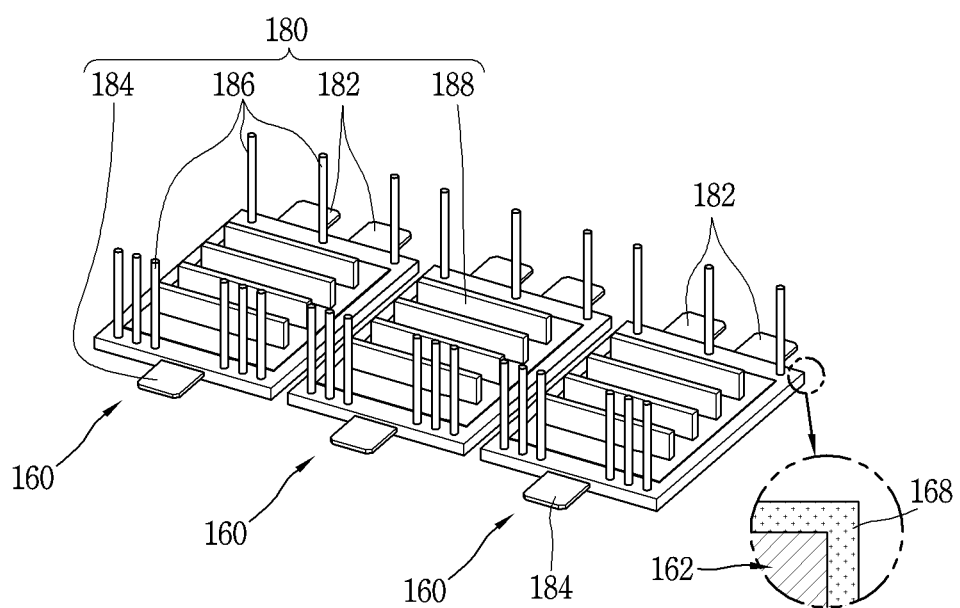
FIG. 5 is a perspective view of a power device of FIG. 3.
Figure 6:
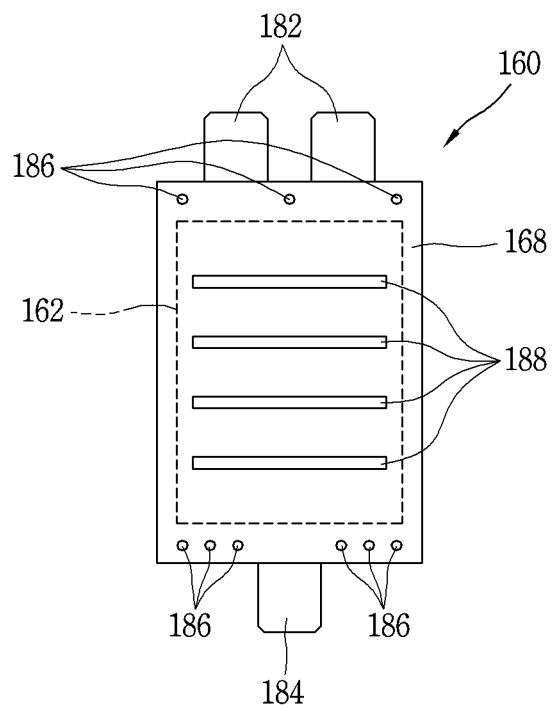
FIG. 6 is a planar view of a power device of FIG. 5.

FIG. 5 is a perspective view of the power device of FIG. 3, and FIG. 6 is a planar view of the power device of FIG. 5. As illustrated in FIGS. 5 and 6, the power device 160 may be implemented in plural. The power device 160 may be implemented in three, for example. Each of the power devices 160 may include, for example, a circuit element assembly 162 having a plurality of terminals 180 and a plurality of circuit elements constituting a circuit, and a coating layer 168 formed to surround a periphery of the circuit element assembly 162 so that end portions of the plurality of terminals 180 are externally exposed.

The circuit element assembly 162 may be configured as a switching circuit to enable frequency conversion of an input power source by including the plurality of circuit elements, for example. The plurality of circuit elements may include, for example, four switching elements 164 and four diodes 166. Here, the switching element 164 may be implemented as an insulated/isolated gate bi-polar transistor, called IGBT, for example. In this embodiment, the power device 160 is exemplified as having four switching elements 164 and four diodes 166. However, this is merely an example, and the number may be appropriately adjusted.

The plurality of terminals 180 may include, for example, input terminals 182 protruding outward of one side surface of the housing 200 and output terminals 184 protruding outward of another side surface of the housing 200. The input terminals 182 and the output terminals 184 may be disposed at opposite side surfaces.

The input terminals 182 may pass through one side wall of the housing 200 to be externally exposed. The output terminals 184 may pass through a side wall opposite to the one side wall of the housing 200 to be externally exposed. The input terminals 182 may be electrically connected to the DC link capacitor 390. Accordingly, the power device 160 may receive a direct current power source from the DC link capacitor 390. To the output terminal 184, an output cable (e.g., a lead wire or a power line of a motor), not illustrated, may be electrically connected. According to this configuration, a connection distance between the input terminal 182 and the DC link capacitor 390 can be significantly shortened. In addition, interference between the output cable and peripheral components (e.g., the input terminal 182 and the DC link capacitor 390) can be suppressed.

The plurality of terminals 180 may include, for example, communication pins 186 each having one side thereof connected to the circuit element assembly 162 and another side thereof protruding outward of the housing 200. The communication pins 186 may be provided at opposite side surfaces of the power device 160, respectively. More specifically, the communication pins 186 may extend in a horizontal direction from each of the circuit elements (switching elements 164 and diodes 166) to protrude outward of opposite side surfaces of the power device 160 (front and rear in the drawing), and then bent upward in the thickness direction of the power device 160. This is to communicatively connect the gate board 400 provided above the power device 160 and each of the circuit elements. Accordingly, by controlling each of the circuit elements, a direct current power source inputted to the circuit elements of each power device 160 can be converted into an alternative current power source of a desired frequency.

Each of the power devices 160 may include a plurality of cooling fins 188 protruding to both sides (upper side and lower side in the drawing) in the thickness direction. As a result, a contact area between the power device 160 and the cooling fluid L increases, thereby facilitating cooling of the power device 160. More specifically, the power device 160 is provided with the cooling fins 188 each having one side thereof connected to the circuit element assembly 162 and another side thereof protruding outward of the coating layer 168 to exchange heat with the cooling fluid L by a contact between the cooling fluid L and the cooling fins 188. Each of the cooling fins 188 may be configured to protrude respectively outward of both sides (upper side and lower side) from both plate surfaces (upper surface and lower surface) of the power device 160 in the thickness direction.

The cooling fins 188 are in direct contact with cooling fluid L for heat exchange, thereby cooling the power device 160 more quickly.

Each of the power devices 160 may be configured (manufactured) by forming, for example, the circuit element assembly 162 by connecting the plurality of circuit elements having the plurality of terminals 180 and constituting a circuit, and by forming the coating layer 168 to surround the circuit element assembly 162 with end portions of the plurality of terminals 180 being externally exposed.

The plurality of circuit elements may be arranged in a substantially square shape, for example. More specifically, the plurality of circuit elements may be arranged in a substantially square shape by disposing four switching elements 164 (insulated gate bipolar transistor (IGBT)) in a "¬" shape to correspond to three corners of the square on a plane, and by disposing four relatively small diodes 166 arranged in a square shape on a remaining corner area of the square. The circuit element assembly 162 constituting a frequency conversion circuit may be configured by connecting the plurality of circuit elements to each other in a predetermined pattern. The input terminals 182 and the output terminals 184 may be connected to the circuit element assembly 162 so that power can be inputted to and outputted from the frequency conversion circuit.

The circuit element assembly 162 may include communication pins 186 connected to the plurality of circuit elements. The circuit element assembly 162 may include the cooling fins 188 configured to cool the plurality of circuit elements. Each of the cooling fins 188 may be configured to protrude from both plate surfaces (upper surface and lower surface in the drawing) in the thickness direction of the circuit element assembly 162 and extend in one direction, respectively. Each of the cooling fins 188 may be configured to extend in a moving direction of cooling fluid L, for example. In this embodiment, four cooling fins 188 are formed on each of plate surfaces of the power device 160 in a thin plate shape, but the size and shape thereof may be appropriately adjusted.

Each of the power devices 160 may include the coating layer 168 formed to surround the circuit element assembly 162 with respective end portions of the plurality of terminals 180 (input terminals 182, output terminals 184, communication pins 186, and cooling fins 188) connected to the circuit element assembly 162 being externally exposed.

The coating layer 168 may be formed by injection molding a synthetic resin member around the circuit element assembly 162, for example. Accordingly, a direct contact between the circuit element assembly 162 and a conductive material such as water can be suppressed, so that each of the power devices 160 can have electrical insulation performance.

Figure 7:
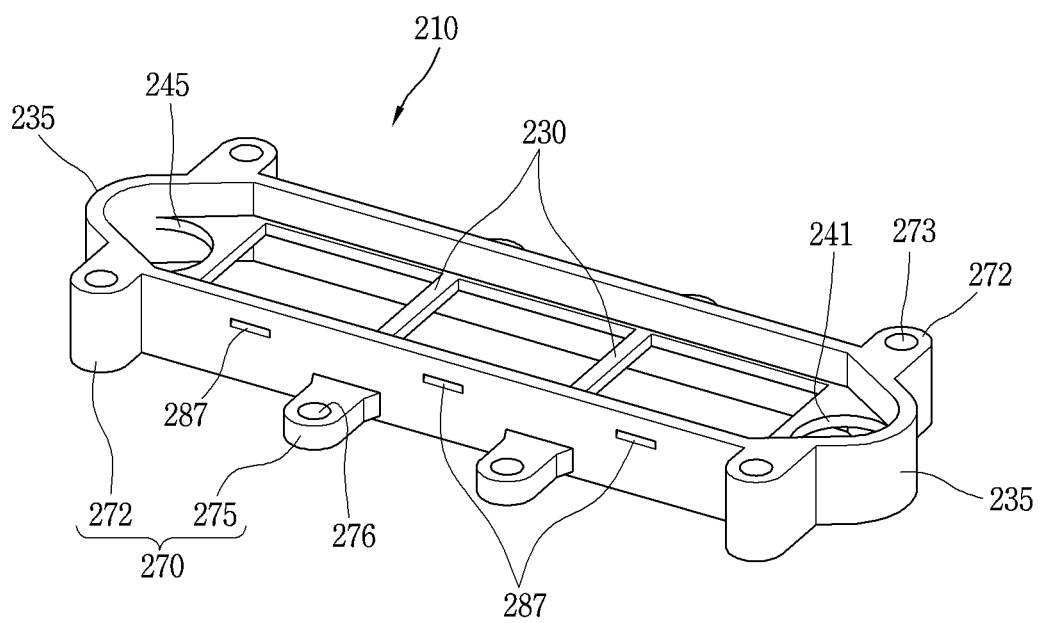
FIG. 7 is a perspective view of a first housing without a power device of FIG. 3.
Figure 8:
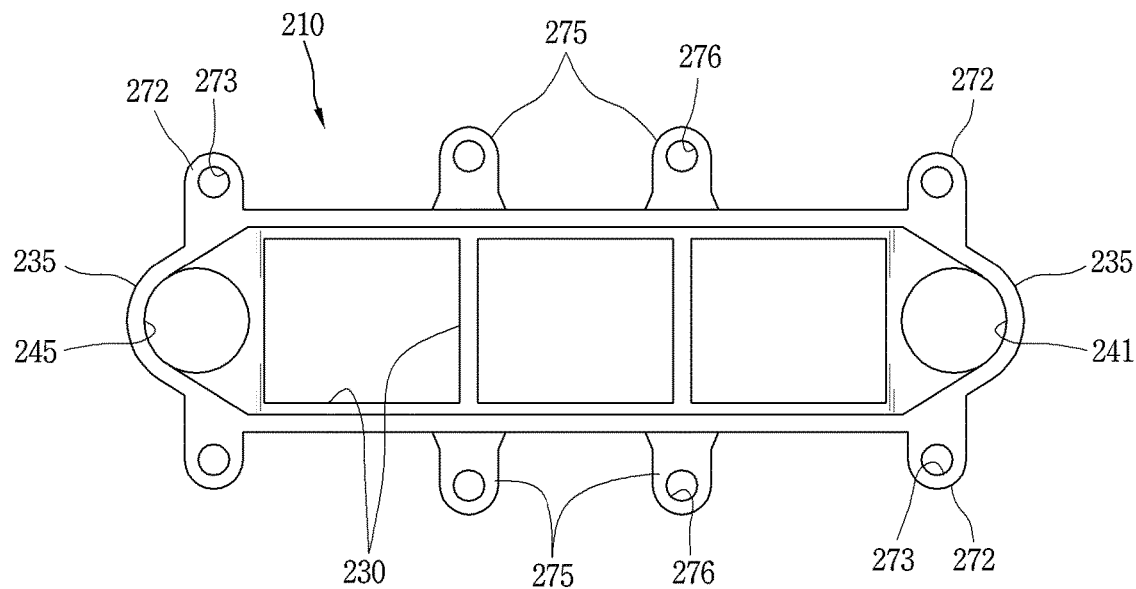
FIG. 8 is a planar view of a first housing of FIG. 7.

FIG. 7 is a perspective view of the first housing without the power device of FIG. 3, and FIG. 8 is a planar view of the first housing of FIG. 7. As illustrated in FIGS. 7 and 8, the first housing 210 may be provided with an accommodating space for each of the power devices 160 and flow paths 205 for cooling fluid L each formed at both sides (upper side and lower side) of the power device 160 therein. A lower flow path 206 may be provided under the power device 160, and an upper flow path 207 may be provided above the power device 160. The first housing 210 may be implemented by injection molding a synthetic resin member around each of the power devices 160, for example. The first housing 210 may be formed to be opened vertically, for example.

The first housing 210 may be implemented in a substantially rectangular parallelepiped shape. The first housing 210 may be configured to have a length to accommodate three power devices 160 spaced apart from each other in one direction on a same plane therein. The first housing 210 may be configured to include, for example, two long side portions and two short side portions. The first housing 210 may include an edge covering portion 230 that surrounds edges of four side surfaces of each of the power devices 160 with a predetermined width. Accordingly, both plate surfaces (upper surface and lower surface in the drawing) of each of the three power devices 160 can be more quickly cooled by being exposed to directly contact the cooling fluid L and directly exchanging heat with the cooling fluid L. Between the three power devices 160, two common edge covering portions 230 may be formed to allow end portions of two power devices 160 to be inserted therein and covered by the two common edge covering portions 230 at once. The edge covering portions 230 may be formed at a central region of a total height in the thickness direction of the first housing 210.

Each of the flow paths 205 for cooling fluid L may be provided above and below the edge covering portion 230, respectively. The inlet portion 241 through which cooling fluid L flows in may be formed at one end portion (right end portion in the drawing) in a lengthwise direction of the first housing 210. The outlet portion 245 through which the cooling fluid L flows out may be formed at another end portion (left end portion in the drawing) in the lengthwise direction of the first housing 210. In inner side regions of both end portions of the first housing 210, the edge covering portion 230 is formed to extend horizontally to an inner side of each of the protrusions 235, and the inlet portion 241 and the outlet portion 245 may be formed through each extended portion of the edge covering portion 230 in a cylindrical shape, for example. Accordingly, the cooling fluid L introduced in through the inlet portion 241 may respectively pass through an upper side and a lower side of the edge covering portion 230 to move in the lengthwise direction of the first housing 210. The cooling fluid L introduced into the housing 200 through the inlet portion 241 may be moved while cooling the three power devices 160, then flow out of the housing 200 through the outlet portion 245.

Figure 9:
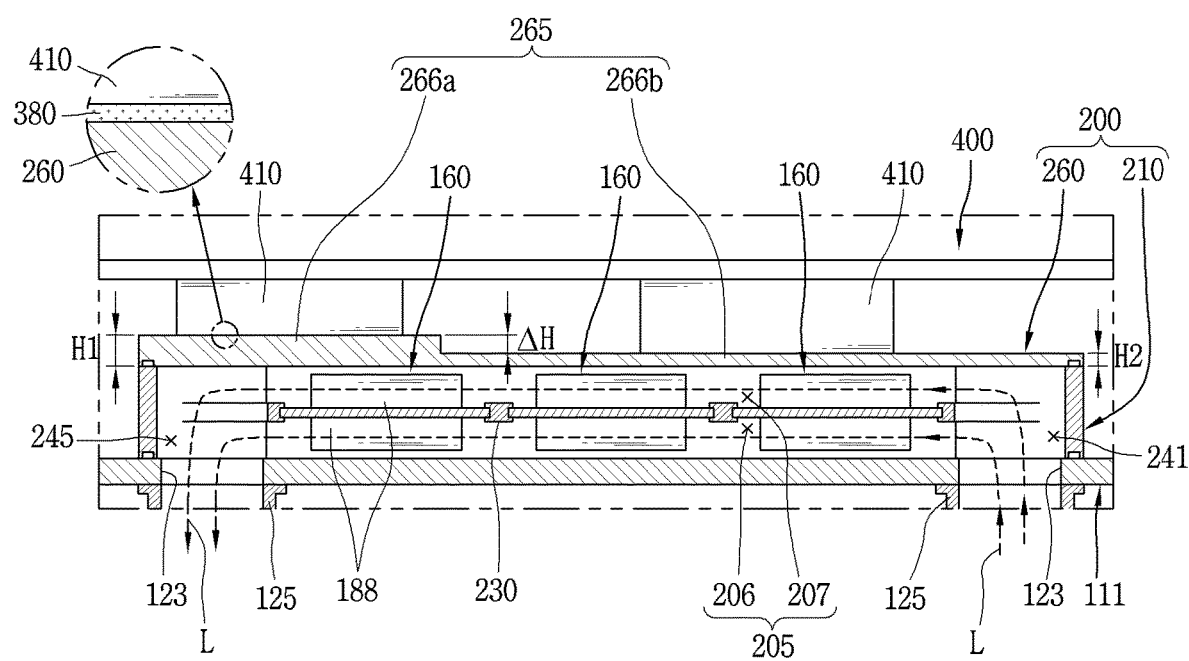
FIG. 9 is a sectional view of a region of a power module of FIG. 2.

FIG. 9 is a sectional view of the power module of FIG. 2. As illustrated in FIG. 9, the gate board 400 may be connected to the communication pins 186 of the power device 160. The gate board 400 may be provided, for example, above the housing 200. The gate board 400 may include high-temperature elements 410 having relatively large amount of heat, and the gate board 400 may be disposed with the high-temperature elements 410 facing the housing 200. The gate board 400 may be coupled to the housing 200 with the high-temperature elements 410 being in contact with the housing 200. As a result, a cooling of the high-temperature elements 410 can be facilitated by being brought into contact with the housing cooled by the cooling fluid L to have a relatively low surface temperature.

The housing 200 may include the first housing 210 and the second housing 260. The second housing 260 may be formed of a metal member. Accordingly, a heat transfer between the cooling fluid L and the high-temperature elements 410 may be performed more quickly. The second housing 260 may include a high-temperature element contact portion 265 to be brought into contact with the high-temperature elements 410 of the gate board 400. The high-temperature element 410 may be provided in plural each having a height different from each other. The high-temperature element contact portion 265 may be configured to contact each of the plurality of high-temperature elements 410 having a height difference $\Delta H$.

More specifically, the high-temperature element contact portion 265 may include, for example, a first high-temperature element contact portion 266a and a second high-temperature element contact portion 266b formed in a stepped shape with a height difference ($\Delta H$). The first high-temperature element contact portion 266a may have a relatively high height H1. The second high-temperature element contact portion 266b may have a relatively low height H2. Accordingly, each of surfaces of the high-temperature elements protruding from a plate surface of the gate board 400 and having different heights may contact each of the high-temperature element contact portions, so that cooling of the plurality of high-temperature elements 410 may be further facilitated. Between the high-temperature element contact portion 265 and the high-temperature elements 410, a thermal interface material 380, for example, may be inserted. Accordingly, air (air volume) between the high-temperature element contact portion 265 and the high-temperature element 410 is reduced, so that heat transfer may be facilitated.

Figure 10:
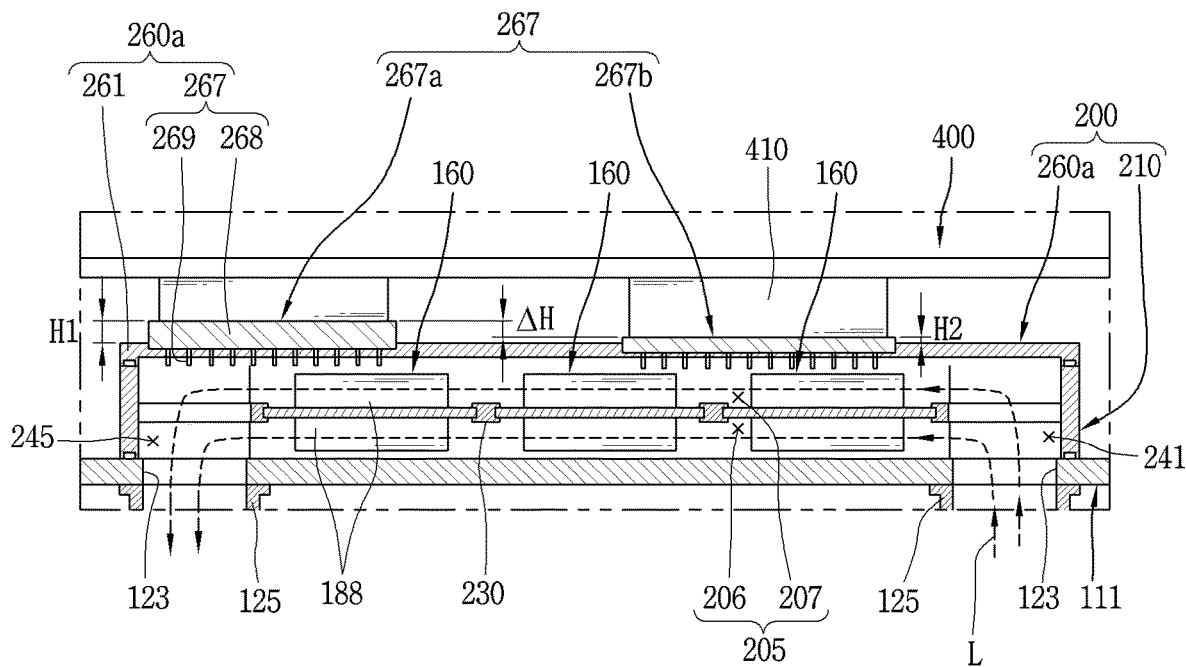
FIG. 10 is a modified example of a second housing of FIG. 9.

FIG. 10 is a modified example of a second housing of FIG. 9. As illustrated in FIG. 10, the second housing 260a may be formed by forming a synthetic resin member in a substantially plate shape. The second housing 260a may include high-temperature element contact portions 267 to contact the high-temperature elements 410 of the gate board 400. The high-temperature element contact portions 267 may be formed of, for example, a metal member. The second housing 260a may include, for example, a plate-shaped body 261 and the high-temperature element contact portions 267 provided on the body 261.

The body 261 may be formed of, for example, a synthetic resin member, and the high-temperature element contact portion 267 may be formed of a metal member. The second housing 260a may be configured by insert molding the high-temperature element contact portion 267, for example. The high-temperature element contact portion 267 may be configured to have different heights corresponding to the heights of the high-temperature elements 410 of the gate board 400. The high-temperature element contact portion 267 may be configured to include, for example, a plate-shaped high-temperature element contact portion main body 268 having a predetermined thickness of a metal member and a plurality of heat dissipation fins 269 protruding from the high-temperature element contact portion main body 268.

The high-temperature element contact portion main body 268 may be disposed on an outer surface of the body 261, and the heat dissipation fins 269 may be configured to pass through the body 261 to be brought into contact with cooling fluid L inside the body 261. The high-temperature element contact portion 267 may be configured in plural to have a height difference $\Delta H$. The high-temperature element contact portion 267 may include a first high-temperature element contact portion 267a having a relatively high height H1 and a second high-temperature element contact portion 267b having a relatively low height H2. The high-temperature element contact portion main body 268 may be disposed to have different heights from the body 261. The thermal interface material 380 may be provided between the high-temperature element contact portion 267 and the high-temperature elements 410 as described above. Accordingly, air (air volume) between the high-temperature element contact portion 267 and the high-temperature elements 410 is reduced, so that heat transfer may be facilitated.

Figure 11:
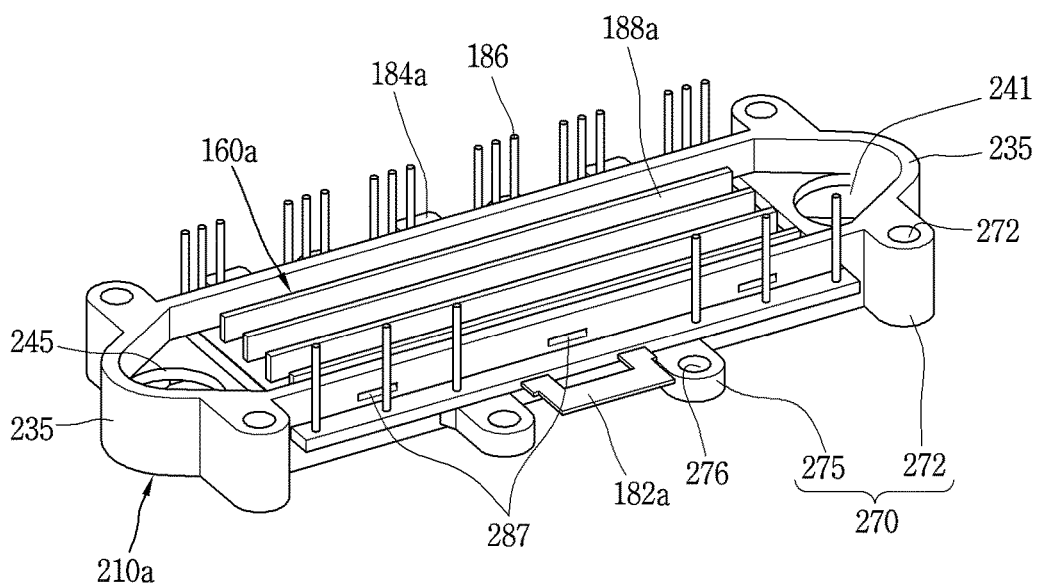
FIG. 11 is a modified example of a power device of FIG. 3.
Figure 12:
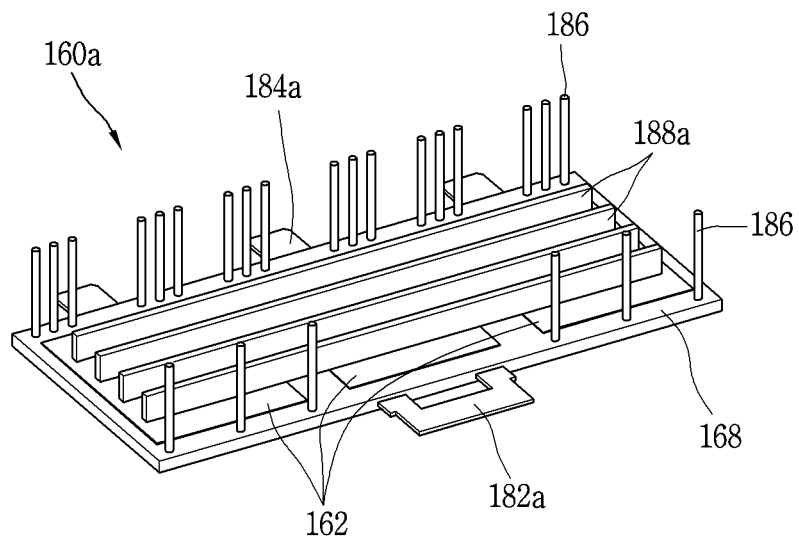
FIG. 12 is a perspective view of a power device of FIG. 11.
Figure 13:
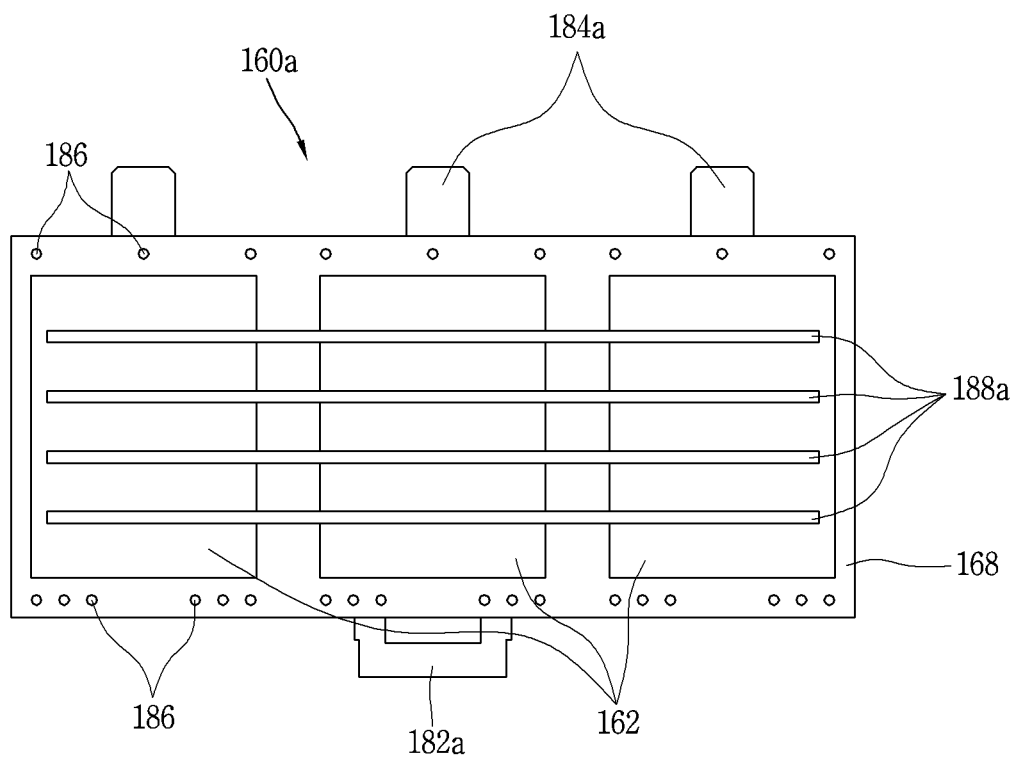
FIG. 13 is a planar view of a power device of FIG. 12.

FIG. 11 is a modified example of the power device of FIG. 3, FIG. 12 is a perspective view of the power device of FIG. 11, and FIG. 13 is a planar view of the power device of FIG. 12. As illustrated in FIG. 11, a power module 150 may be configured to include a power device 160a for converting and outputting a frequency of an input power source, and a housing 200 accommodating the power device 160a therein and forming flow paths 205 for a cooling fluid L on both sides of the power device 160a such that the cooling fluid L can contact the both sides of the power device 160a. The power device 160a may be formed, for example, as a single body as illustrated in FIG. 12. The power device 160a may include, for example, a circuit element assembly 162 provided with a plurality of circuit elements having a plurality of terminals 180 and constituting a circuit, and a coating layer 168 formed to surround a periphery of the circuit element assembly 162 so that end portions of the plurality of terminals 180 are externally exposed. The circuit element assembly 162 may include an input terminal 182a provided at one side surface thereof and a plurality of output terminals 184a provided at another side surface thereof.

In this embodiment, the input terminal 182a is implemented in one and the output terminals 184a are implemented in three. In this embodiment, the circuit element assembly 162 is implemented in three and the coating layer 168 is implemented in one. However, this is merely an example, and the number may be appropriately adjusted. In this embodiment, a plurality of cooling fins 188 may be provided on both plate surfaces of the circuit element assembly 162, respectively. The cooling fins 188 of this embodiment may be configured such that four cooling fins 188 are provided on each of surfaces of the three circuit element assemblies 162. Each of the four cooling fins 188 may be configured to have a length extending corresponding to a length of the coating layer 168. A plurality of communication pins 186 may be provided on both side surfaces of the circuit element assembly 162, respectively.

The housing 200 may include a first housing 210a that is opened upward to form an accommodating space therein, and a second housing 260 that blocks an upper opening of the first housing 210a.

Figure 14:
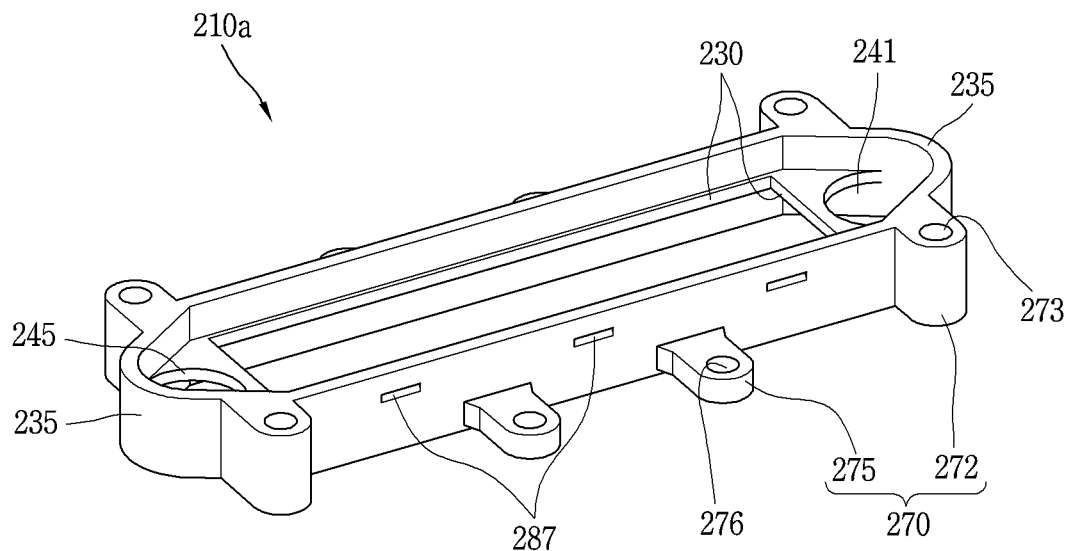
FIG. 14 is a perspective view of a first housing of FIG. 11.
Figure 15:
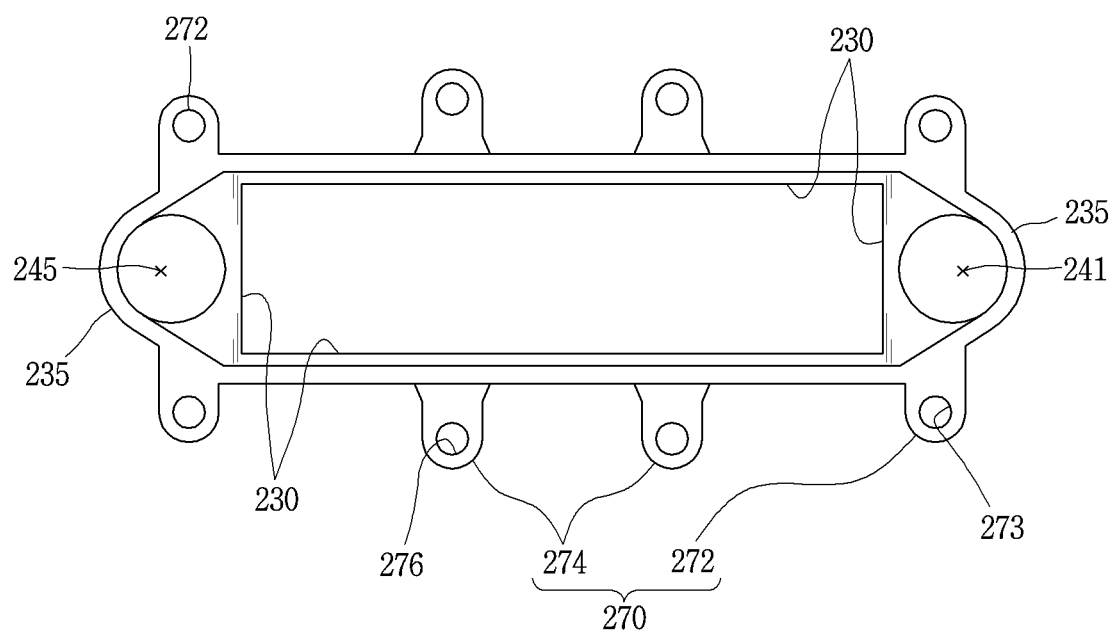
FIG. 15 is a planar view of a first housing of FIG. 14.

FIG. 14 is a perspective view of the first housing of FIG. 11, and FIG. 15 is a planar view of the first housing of FIG. 14. As illustrated in FIGS. 14 and 15, the first housing 210a of this embodiment may accommodate, for example, the single-bodied power device 160a therein, and may be provided with flow paths 205 for cooling fluid L formed at both sides (upper side and lower side in the drawing) of the power device 160a, respectively. The first housing 210a may be formed in a rectangular parallelepiped shape having, for example, two long side portions and two short side portions. The first housing 210a of this embodiment may be formed to be opened vertically, for example. An edge covering portion 230 may be formed inside the first housing 210a so as to surround edges of four sides of the power device 160a with a predetermined width, respectively. Both plate surfaces (upper surface and lower surface in the drawing) of the single power device 160a can be quickly cooled by being in direct contact with the cooling fluid L and directly exchanging heat with the cooling fluid L. At both end portions of the first housing 210a, an inlet portion 241 and an outlet portion 245 for inflow and outflow of the cooling fluid L may be formed, respectively.

Figure 16:
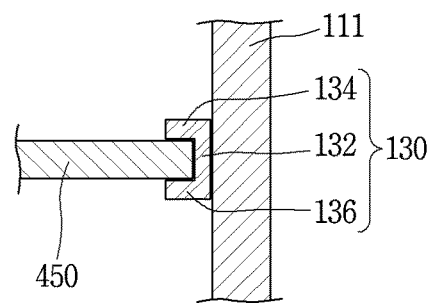
FIG. 16 is an enlarged sectional view of a contact area of a control board and a case in FIG. 1.

FIG. 16 is an enlarged sectional view of the contact area of the control board and the case in FIG. 1. As illustrated in FIG. 16, the control board 450 may be provided inside the case 110 of the inverter, and an insulating member 130 may be provided between the control board 450 and the case 110.

The insulating member 130 may be configured to surround a periphery of the control board 450, for example. The insulating member 130 may include a vertical section 132 disposed on a side of the control board 450, and a first horizontal section 134 and a second horizontal section 136 disposed on both plate surfaces (upper surface and lower surface in the drawing) of the control board 450, respectively. Accordingly, a horizontal distance between an end portion of the control board 450 and the case 110 is shortened, but a creeping distance of the control board 450 may be further extended. According to this configuration, it is possible to suppress an increase in a floor area of the case 110 in order to secure an insulation distance between the control board 450 and the case 110, thereby reducing the floor area of the case 110.

In this embodiment, although the control board 450 is embodied as being disposed close to an inner surface of the case 110, when the gate board 400 is disposed close to the inner surface of the case 110, it goes without saying that an insulating member having the vertical section, the first horizontal section, and the second horizontal section may be provided between the gate board 400 and the case 110.

Figure 17:
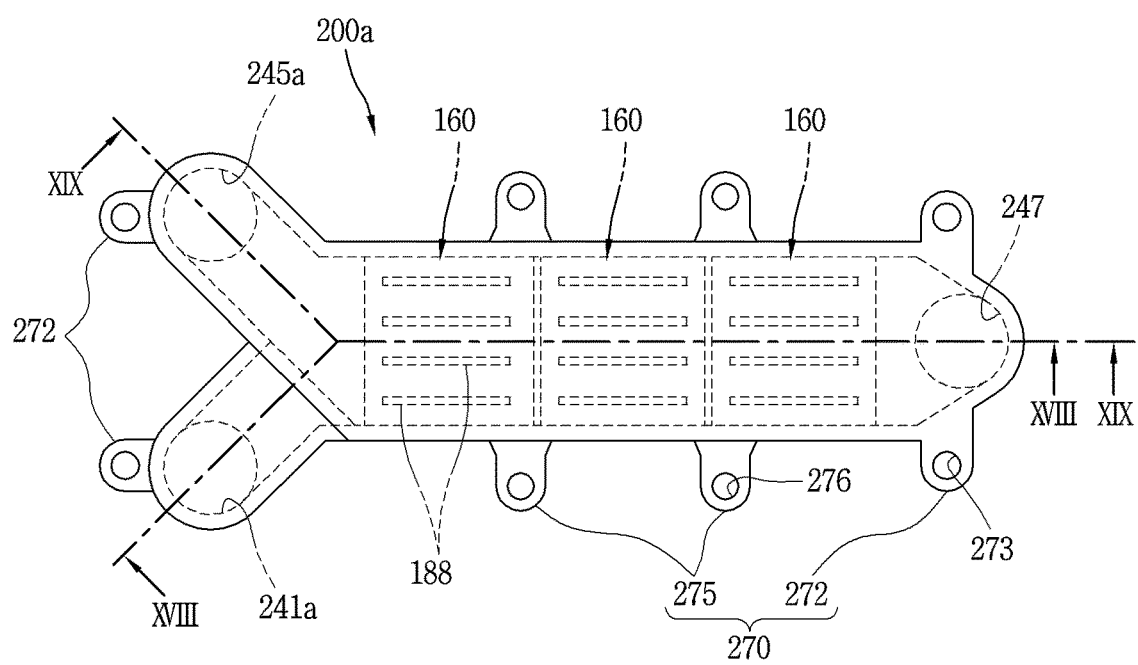
FIG. 17 is a modified example of a housing of FIG. 3.
Figure 18:
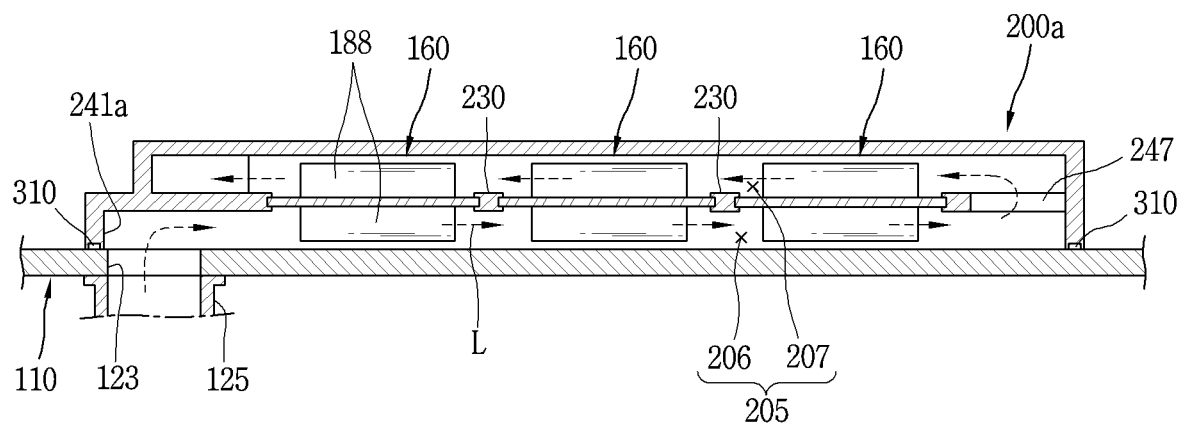
FIG. 18 is a sectional view taken along "-" line of FIG. 17.
Figure 19:
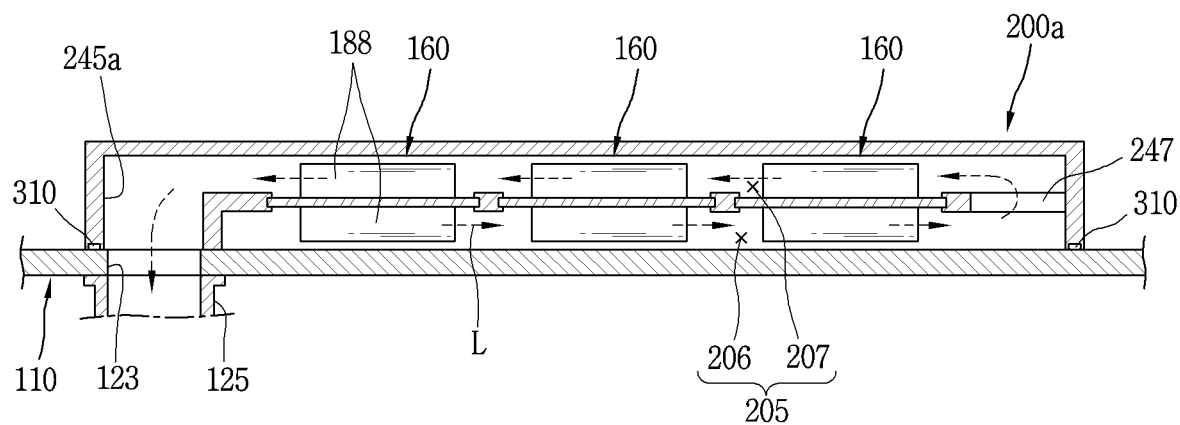
FIG. 19 is a sectional view taken along line XIX-XIX of FIG. 17.

Hereinafter, a housing of a power module according to another embodiment of the present disclosure will be described with reference to FIGS. 17 to 24. FIG. 17 is a modified example of the housing of FIG. 3, FIG. 18 is a sectional view taken along "-" line of FIG. 17, and FIG. 19 is a sectional view taken along line XIX-XIX of FIG. 17. As illustrated in FIG. 17, a power module 150 of this embodiment includes a power device 160 for converting and outputting a frequency of an input power source, and a housing 200a accommodating the power device 160 therein and forming flow paths 205 for a cooling fluid L on both sides of the power device 160 such that the cooling fluid L can contact the both sides of the power device 160. The power device 160 may be implemented in three or one, for example, as described above. A description of the power device 160 is omitted and replaced with the above description. Although not specifically illustrated, the housing 200a according to this embodiment may be configured to include, as described above, a first housing having an upwardly opened accommodating space therein, and a second housing coupled to block an upper opening of the first housing. The housing 200a according to this embodiment may be provided with an inlet portion 241a and an outlet portion 245a to allow a cooling fluid L to flow in and out therethrough. In this embodiment, the inlet portion 241a and the outlet portion 245a may be provided at one end portion of the housing.

The inlet portion 241a may be formed in a shape protruding obliquely to one side (lower side in the drawing) with respect to a lengthwise direction of the housing at one end portion (left end portion in the drawing) of the housing. The outlet portion 245a may be formed in a shape protruding obliquely to another side (upper side in the drawing) with respect to the lengthwise direction of the housing at the one end portion of the housing.

At another end portion of the housing (right end portion in the drawing), a communication portion 247 configured to communicate a flow path 205 for cooling fluid L formed above the power device 160 and a flow path 205 for cooling fluid L formed under the power device 160 may be provided. The communication portion 247 may be formed through one side portion of the power device 160 in a thickness direction (vertical direction in the drawing).

According to this configuration, as illustrated in FIG. 18, the cooling fluid L (cooling water) introduced into the housing through the inlet portion 241a may cool the power device 160 while moving along the flow path for a cooling fluid L (lower flow path 206) provided under the power device 160. The cooling fluid L moved along the lower flow path 206 to get to another side of the housing (right side in the drawing) may pass through the communication portion 247 to move along an upper flow path 207 provided above the power device 160, as illustrated in FIG. 19.

The cooling fluid L moved along the upper flow path 207 may exchange heat with the power device 160 to cool the power device 160, and then flow out of the housing 200a through the outlet portion 245a. The cooling fluid L that has flowed out of the housing 200a may be cooled by a separate cooling means (the radiator), and then repeats the process of cooling the power device 160 by flowing into the housing 200a through the inlet portion 241a and moving along the flow path 205 for cooling fluid L.

Figure 20:
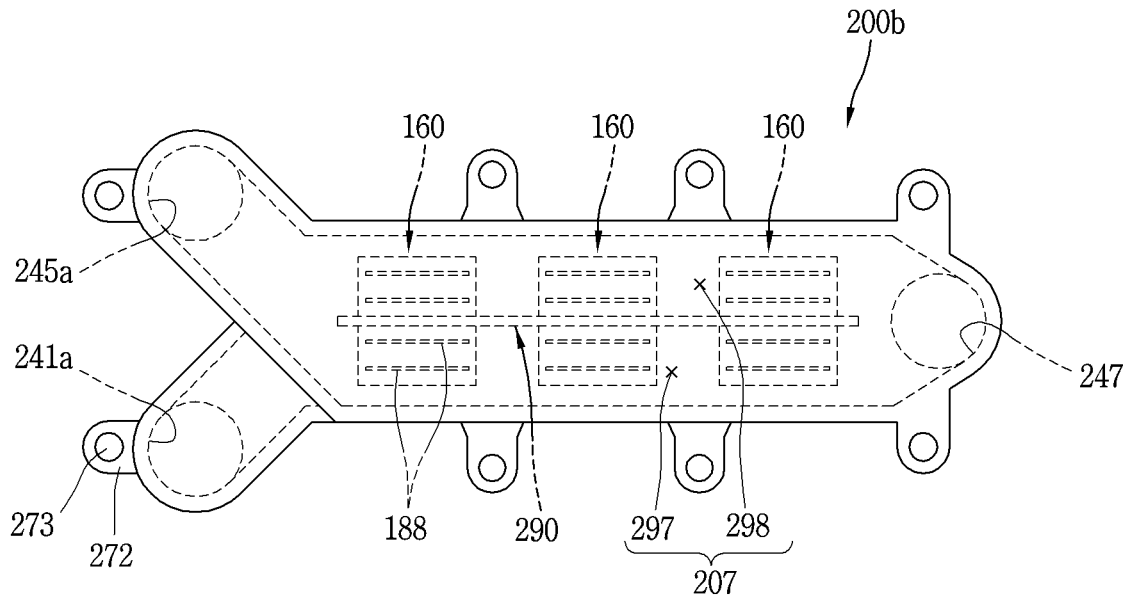
FIG. 20 is a modified example of a housing of FIG. 17.
Figure 21:
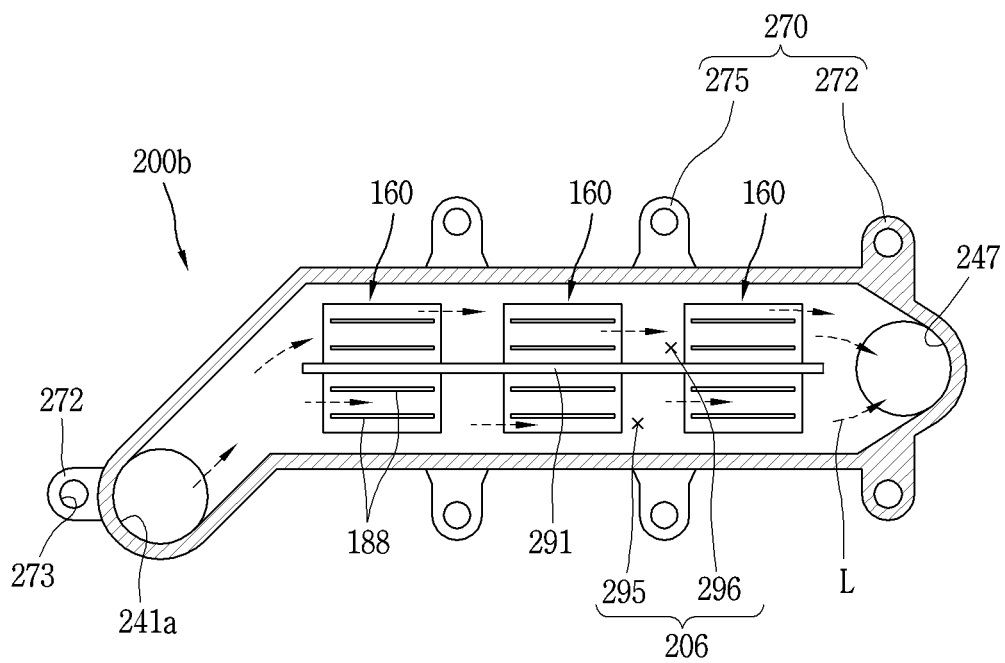
FIG. 21 is a view of an inside of an inlet side of FIG. 20.
Figure 22:
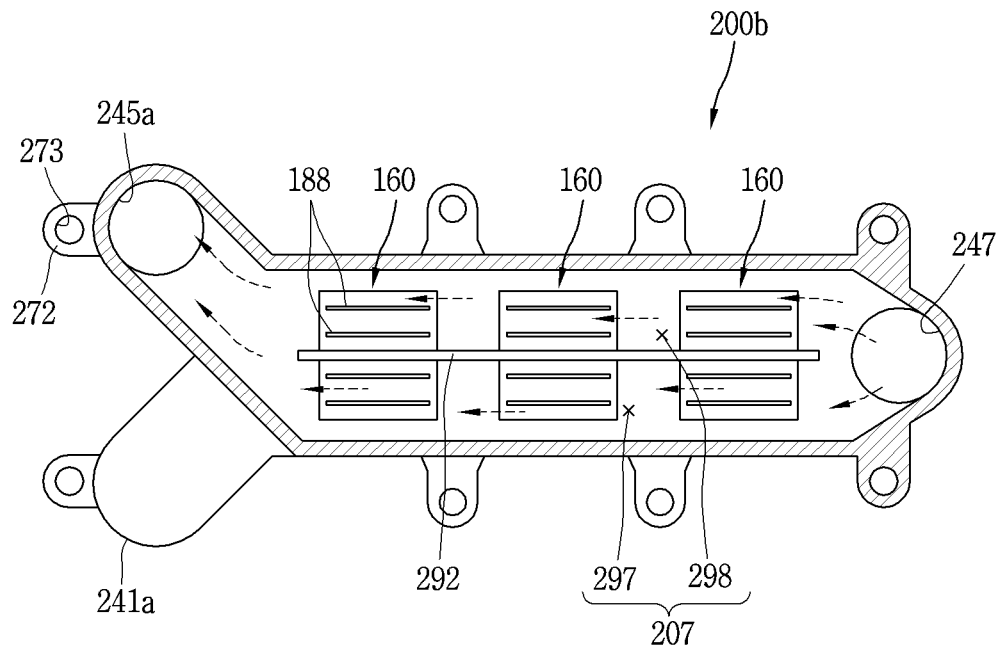
FIG. 22 is a view of an inside of an outlet side of FIG. 20.

FIG. 20 is a modified example of the housing of FIG. 17, FIG. 21 is a view of an inside of an inlet side of FIG. 20, and FIG. 22 is a view of an inside of an outlet side of FIG. 20. As illustrated in FIG. 20, a power module 150 of this embodiment may include a power device 160 and a housing 200b. At one end portion in a lengthwise direction of the housing 200b, an inlet portion 241a through which a cooling fluid L flows into the housing 200b and an outlet portion 245a through which a cooling fluid L flows outward of the housing 200b may be provided, respectively. At another end portion of the housing 200b, a communication portion 247 configured to communicate a lower flow path 206 of the power device 160 and an upper flow path 207 of the power device 160 may be provided.

Meanwhile, the housing 200b of this embodiment may be provided with a partition portion 290 that partitions an inner space of the housing 200b. Accordingly, a moving path of the cooling fluid L formed in the housing 200b may be increased. And thus, an occurrence of bias (movement) of cooling fluid L inside the housing 200b can be suppressed.

The partition portion 290 may be configured to have a length extended in the lengthwise direction of the housing 200b, for example. The partition portion 290 may be provided at a lower side of the power device 160. The partition portion 290 may be provided at an upper side of the power device 160. The partition portion 290 may include, for example, a first partition portion 291 provided at the lower side of the power device 160, and a second partition portion 292 provided at the upper side of the power device 160.

In this embodiment, the partition portion 290 is exemplified as being provided at both the upper and lower sides of the power device 160. However, this is merely an example, and is not limited thereto. In addition, although one partition portion 290 is disposed at a center in a widthwise direction of the housing 200b, the number of the partition portions 290 may be appropriately adjusted. One end portion (left end portion in the drawing) of the first partition portion 291 disposed at the lower side of the power device 160 may extend to a point spaced apart from the inlet portion 241a by a predetermined distance. Accordingly, the cooling fluid L introduced in through the inlet portion 241a may be branched. Another end portion (right end portion in the drawing) of the first partition portion 291 may extend to the communication portion 247. The lower flow path 206 may include a first lower flow path 295 and a second lower flow path 296 partitioned along the widthwise direction of the housing 200b.

The second partition portion 292 disposed at the upper side of the power device 160 may be configured to extend from the communication portion 247 to a point spaced apart from the outlet portion 245a by a predetermined distance. Accordingly, the upper flow path 207 may include a first upper flow path 297 and a second upper flow path 298 partitioned along the widthwise direction of the housing 200b.

According to this configuration, the cooling fluid L introduced in through the inlet portion 241a may cool the power device 160 while moving along the first lower flow path 295 and the second lower flow path 296 after being branched by the first partition portion 291. The cooling fluid L moved to the another end portion of the housing 200b may be transferred to the upper flow path 207 through the communication portion 247, then cool the power device 160 while moving along the first upper flow path 297 and the second upper flow path 298 after branched by the second partition portion 292. The cooling fluids L passed through the second partition portion 292 may join together and then flow out of the housing 200b through the outlet portion 245a.

Figure 23:
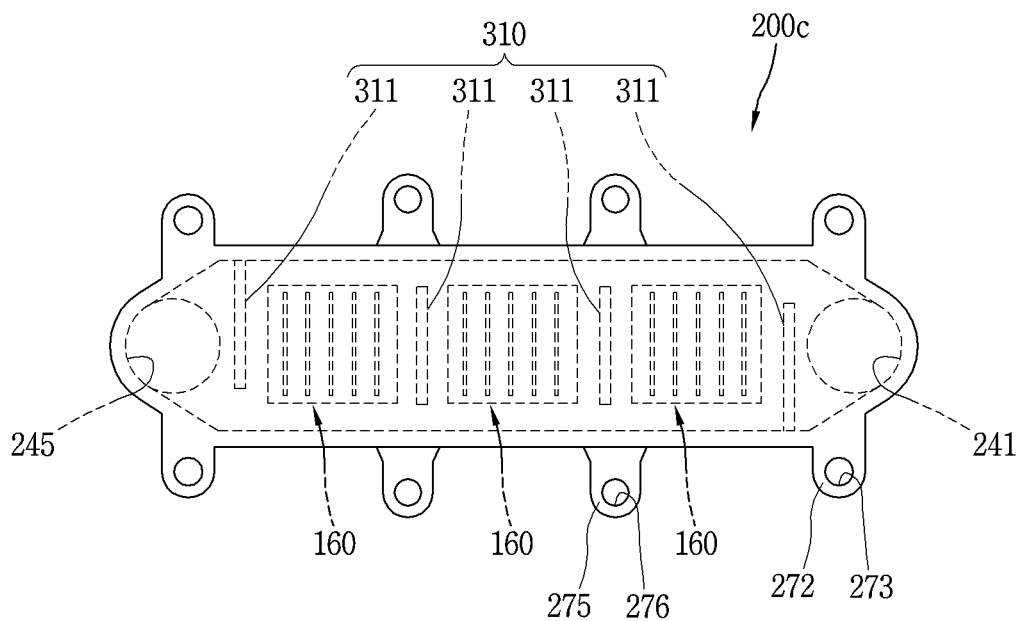
FIG. 23 is a modified example of a housing of FIG. 3.
Figure 24:
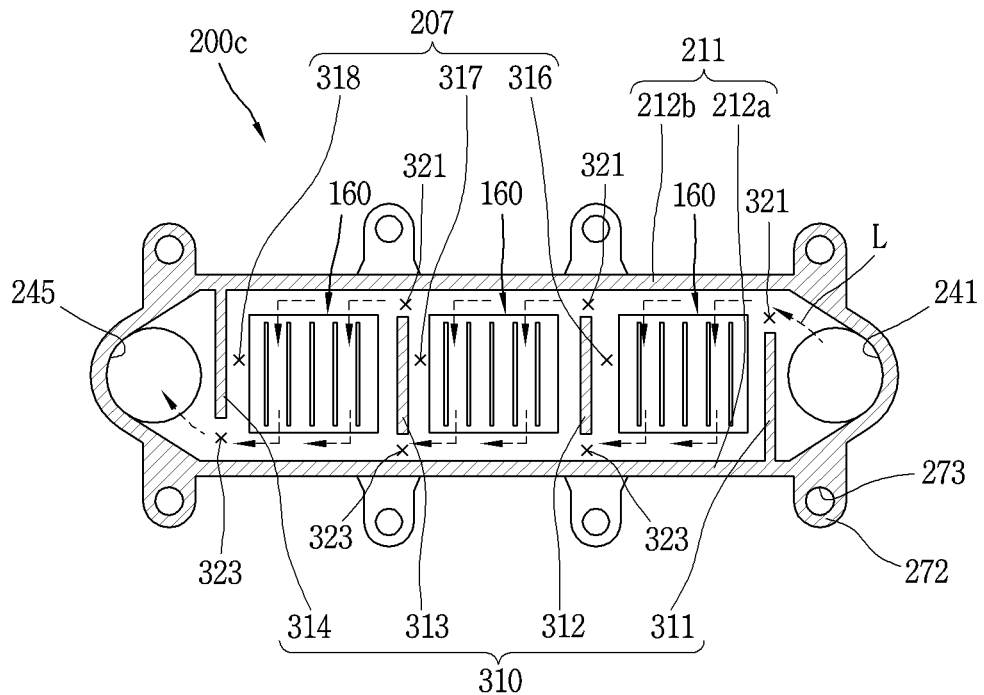
FIG. 24 is a view illustrating an inside of FIG. 23.

FIG. 17 is a modified example of the housing of FIG. 3, and FIG. 24 is a view illustrating an inside of FIG. 23. A power module 150 of this embodiment may include a power device 160 and a housing 200c accommodating the power device 160 therein. Each of flow paths 205 for cooling fluid L (lower flow path 206 and upper flow path 207) through which cooling fluid L flows may be formed at a lower side and an upper side of the power device 160 in the housing 200c, respectively. The lower flow path 206 and the upper flow path 207 may communicate with each other. The housing 200c of this embodiment is implemented in a rectangular parallelepiped shape having a long side portion 211 and a short side portion. In a lengthwise direction of the housing 200c of this embodiment, an inlet portion 241 through which a cooling fluid L flows in may be formed at one end portion (right end portion in the drawing), an outlet portion 245 through which cooling fluid L flows out may be formed at another end portion (left end portion in the drawing). The cooling fluid L introduced into the housing 200c through the inlet portion 241 may be moved along each of the lower flow path 206 and the upper flow path 207 communicated with each other, and then merged with each other to flow out of the housing 200c through the outlet portion 245.

Inside the housing 200c of this embodiment, a partition portion 310 configured to partition an inner space of the housing 200c may be provided. The partition portion 310 may be disposed in a widthwise direction of the housing 200c, for example. The partition portion 310 may be implemented in plural, for example, and may be disposed at a predetermined distance in the lengthwise direction of the housing 200c. The partition portion 310 may include, for example, a first partition portion 311, a second partition portion 312, a third partition portion 313, and a fourth partition portion 314 in a moving direction of the cooling fluid L. The first partition portion 311, the second partition portion 312, the third partition portion 313, and the fourth partition portion 314 each may be provided in the lower flow path 206 at the lower side of the power device 160 and the upper flow path 207 at the upper side of the power device 160. Hereinafter, an example in which the first partition portion 311, the second partition portion 312, the third partition portion 313, and the fourth partition portion 314 are provided in the upper flow path 207 will be described.

The first partition portion 311 may be configured to protrude, for example, from a first long side portion 212*a* (long side portion at the front in the drawing) at one side of the inlet portion 241 to extend to a point spaced by a predetermined distance from a second long side portion 212*b* (long side portion at the rear in the drawing). An inlet portion 321 through which a cooling fluid L flows in may be formed between the first partition portion 311 and the second long side portion 212*b*.

The first partition portion 311 may be configured to have a length from a point spaced by a predetermined distance from the second long side portion 212*b* to a point spaced by a predetermined distance from the first long side portion 212*a*. Accordingly, flow paths for a cooling fluid L may be formed between the second partition portion 312 and the first long side portion 212*a* and between the second partition portion 312 and the second long side portion 212*b*, respectively. The inlet portion 321 through which a cooling fluid L flows in may be formed between the second partition portion 312 and the second long side portion 212*b*, and an outlet portion 323 through which a cooling fluid L flows out may be formed between the second partition portion 312 and the first long side portion 212*a*.

The third partition portion 313 may be configured to have a length from a point spaced by a predetermined distance from the second long side portion 212*b* to a point spaced by a predetermined distance from the first long side portion 212*a*. Accordingly, flow paths for a cooling fluid L may be formed between the third partition portion 313 and the first long side portion 212*a* and between the third partition portion 313 and the second long side portion 212*b*, respectively. The inlet portion 321 through which a cooling fluid L flows in may be formed between the third partition portion 313 and the second long side portion 212*b*, and the outlet portion 323 through which a cooling fluid L flows out may be formed between the third partition portion 313 and the first long side portion 212*a*.

Meanwhile, the fourth partition portion 314 may be configured to protrude from the second long side portion 212*b* and extend to a point spaced apart from the first long side portion 212*a* by a predetermined distance, for example. Accordingly, the outlet portion 323 through which a cooling fluid L flows out may be formed between the fourth partition portion 314 and the first long side portion 212*a*.

As a result, cooling passages disposed in parallel with each other may be formed between each of the first partition portion 311, the second partition portion 312, the third partition portion 313, and the fourth partition portion 314. The lower flow path 206 formed at the lower side of the power device 160 may include a first lower flow path, a second lower flow path, and a third lower flow path arranged in parallel with each other, and the upper flow path 207 formed at the upper side of the power device 160 may include a first upper flow path 316, a second upper flow path 317, and a third upper flow path 318.

Meanwhile, the power device 160 may be configured to include cooling fins 188 disposed in the moving direction of the cooling fluid L. Each of the power devices 160 may be provided with a plurality of cooling fins 188 disposed in the widthwise direction of the housing 200*c* and spaced apart from each other in the lengthwise direction of the housing 200*c*.

According to this configuration, a cooling fluid L introduced into the housing 200*c* through the inlet portion 241 may be moved along each of the lower flow path 206 and the upper flow path 207, which are respectively formed at the upper side and the lower side of the power device 160. The cooling fluid L may be introduced in through the inlet portion 321 formed at one side of the first partition portion 311 and then moved along the second long side portion 212*b*. The cooling fluid L moved along the second long side portion 212*b* may be branched to pass through each of the first upper flow path 316, the second upper flow path 317, and the third upper flow path 318, then merged to pass through the outlet portion 323 of the fourth partition portion 314. Then, the cooling fluid L in the upper flow path 207 and the cooling fluid L in the lower flow path 206 are joined together to flow out of the housing 200*c* through the outlet portion 245.

Figure 25:
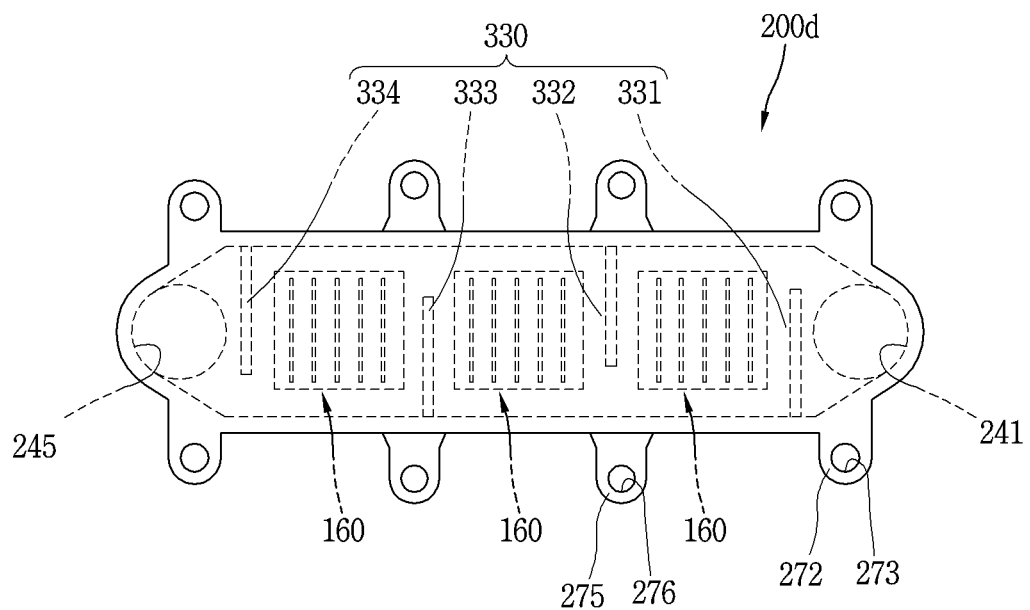
FIG. 25 is a modified example of a housing of FIG. 23.
Figure 26:
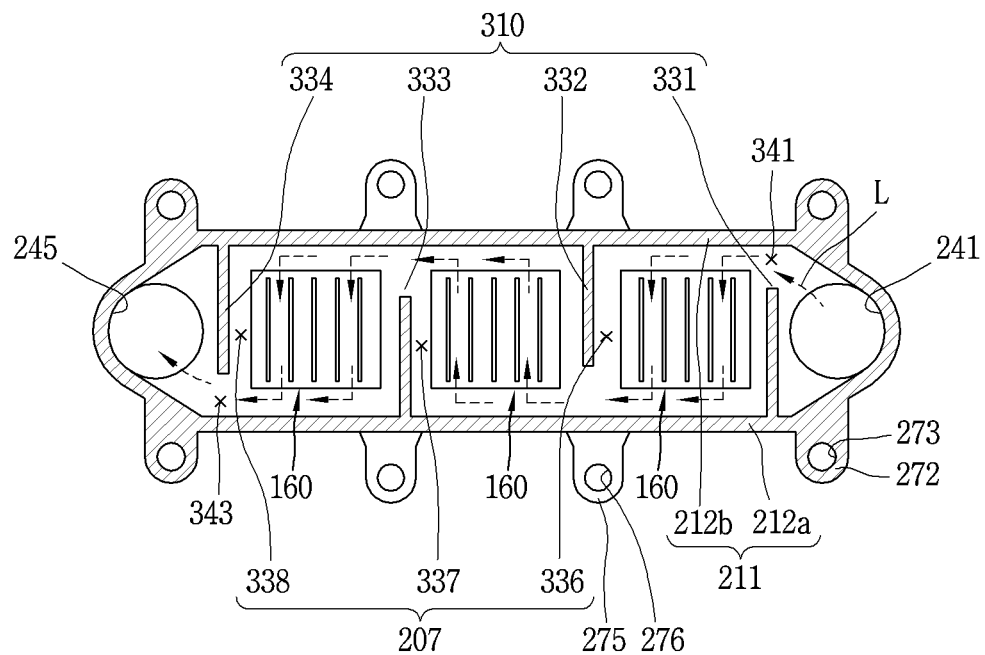
FIG. 26 is a view illustrating an inside of FIG. 25.

FIG. 25 is a modified example of the housing of FIG. 23, and FIG. 26 is a view illustrating an inside of FIG. 25. As illustrated in FIGS. 25 and 26, a power module 150 of this embodiment may include a power device 160 and a housing 200*d* accommodating the power device 160 therein. Each of flow paths 205 for a cooling fluid L (lower flow path 206 and upper flow path 207) through which a cooling fluid L flows may be formed at a lower side and an upper side of the power device 160 in the housing 200*d*, respectively. The upper flow path 207 and the lower flow path 206 may communicate with each other. The housing 200*d* of this embodiment is implemented in a rectangular shape having a long side portion 211 and a short side portion. In a lengthwise direction of the housing 200*d* of this embodiment, an inlet portion 241 through which a cooling fluid L flows in may be formed at one end portion (right end portion in the drawing), an outlet portion 245 through which a cooling fluid L flows out may be formed at another end portion (left end portion in the drawing). The cooling fluid L introduced into the housing 200*d* through the inlet portion 241 may be moved along each of the lower flow path 206 and the upper flow path 207 communicated with each other, and then merged to flow out of the housing 200*c* through the outlet portion 245.

Meanwhile, a partition portion 330 configured to partition an inner space of the housing 200*d* may be provided in the housing 200*d*. The partition portion 330 may be provided in the lower flow path 206 and the upper flow path 207, respectively. In this embodiment, an example in which the partition portion 330 is provided in the upper flow path 207 is described, and a description of the partition portion 330 being provided in the lower flow path 206 is omitted and replaced with the above description of the upper flow path 207.

The partition portion 330 of this embodiment may be arranged in a zigzag form so that the cooling fluid L introduced in through the inlet portion 241 is moved while changing a moving direction thereof in a zigzag form. More specifically, the partition portion 330 may include a first partition portion 331 to a fourth partition portion 334 along the moving direction of the cooling fluid L. The first partition portion 331 may be formed to protrude from the first long side portion 212*a* (front long side portion in the drawing) in a widthwise direction of the housing 200*d* and spaced apart by a predetermined distance from the second long side portion 212*b* (rear long side portion in the drawing). An inlet portion 341 through which a cooling fluid L flows in may be formed between the first partition portion 331 and the second long side portion 212*b*.

The second partition portion 332 may be configured to protrude from the second long side portion 212*b* and extend to a point spaced apart from the first long side portion 212*a* by a predetermined distance, for example. A flow path (both an outlet portion and an inlet portion) for a cooling fluid L may be formed between the second partition portion 332 and the first long side portion 212a.

The third partition portion 333 may be configured to protrude from the first long side portion 212a and extend to a point spaced apart from the second long side portion 212b by a predetermined distance, for example. A flow path (both an outlet portion and an inlet portion) for a cooling fluid L may be formed between the third partition portion 333 and the second long side portion 212b.

The fourth partition portion 334 may be formed to protrude from the second long side portion 212b and extend to a point spaced apart from the first long side portion 212a by a predetermined distance, for example. An outlet portion 343 through which a cooling fluid L flows out may be formed between the fourth partition portion 334 and the first long side portion 212a.

Accordingly, the upper flow path 207 may be provided with a first upper flow path 336, a second upper flow path 337, and a third upper flow path 338 divided by the first partition portion 331 to the fourth partition portion 334 and connected with each other in series. In addition, the lower flow path 206 may be provided with a first lower flow path, a second lower flow path, and a third lower flow path divided by the first partition portion 331 to the fourth partition portion 334 and connected with each other in series.

Meanwhile, the power device 160 may include a plurality of cooling fins 188 disposed in a moving direction of a cooling fluid L. The plurality of cooling fins 188 may be configured to extend in the widthwise direction of the housing 200d and to be spaced apart from each other in the lengthwise direction of the housing 200d.

According to this configuration, a cooling fluid L introduced into the housing 200d through the inlet portion 241 is branched to be moved along the lower flow path 206 and the upper flow path 207, respectively, then introduced in through the inlet portion 341 at one side of the first partition portion 331 to cool the power device 160 while sequentially moving along the first upper flow path 336, the second upper flow path 337, the third upper flow path 338, the first lower flow path, the second lower flow path, and the third lower flow path. Then, the cooling fluid L may be merged to flow out of the housing 200d through the outlet portion 245.

It goes without saying that the directions of the inlet portion and outlet portion formed by the partitions in the above described and illustrated embodiments are merely an example, and the directions may also be opposite to the above described embodiments.

Figure 27:
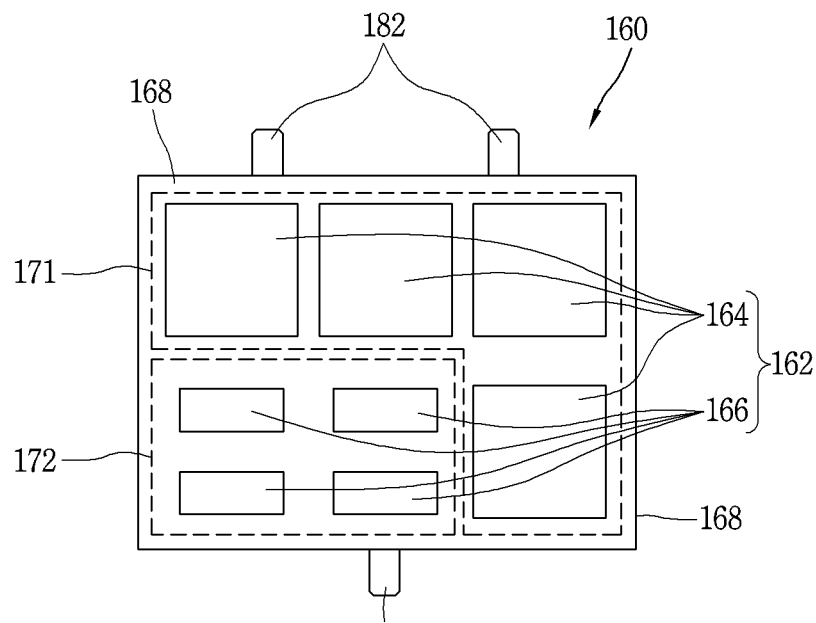
FIG. 27 is a view schematically illustrating an inside of a power device of FIG. 4.
Figure 28:
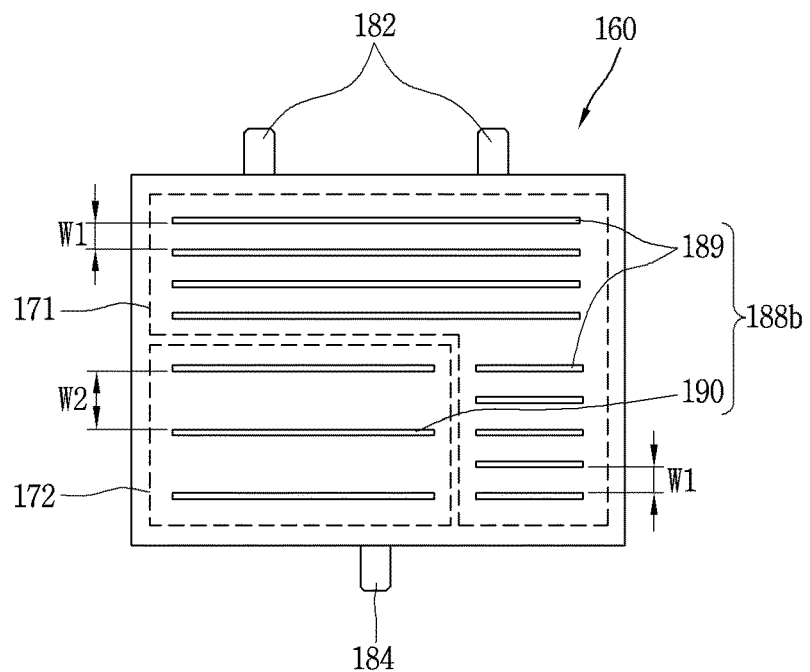
FIG. 28 is a modified example of a power device of FIG. 4.
Figure 29:
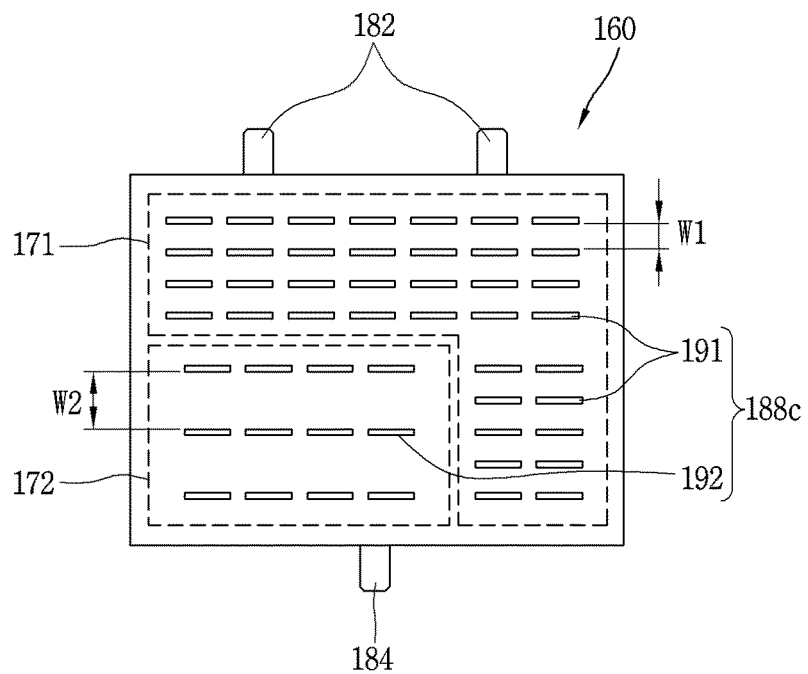
FIG. 29 is another modified example of a power device of FIG. 4.
Figure 30:
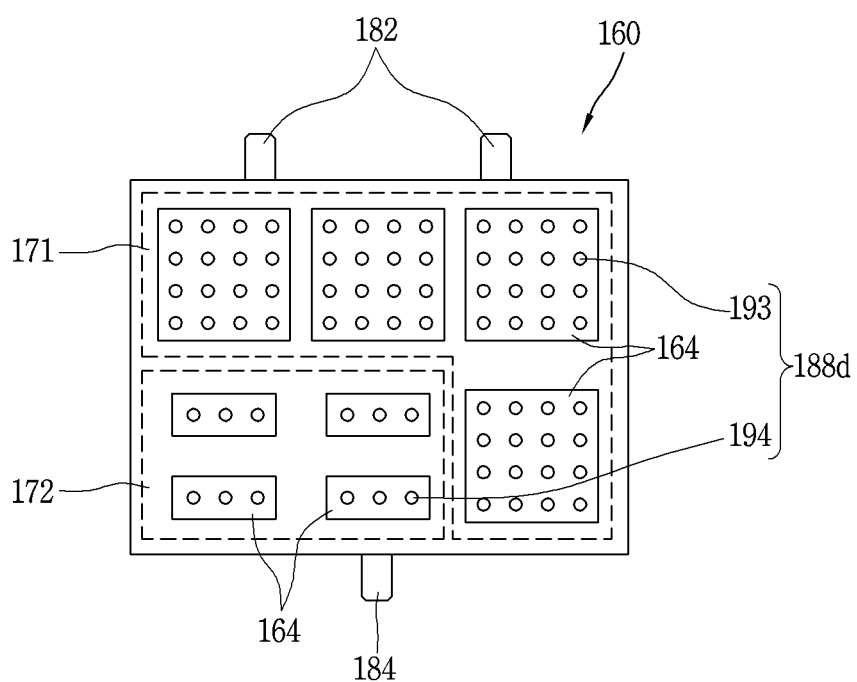
FIG. 30 is still another modified example of a power device of FIG. 4.

Hereinafter, another embodiment of the present disclosure will be described with reference to FIGS. 27 to 30. FIG. 27 is a view schematically illustrating an inside of the power device of FIG. 4, FIG. 28 is a modified example of the power device of FIG. 4, FIG. 29 is another modified example of the power device of FIG. 4, and FIG. 30 is still another modified example of the power device of FIG. 4. As illustrated in FIG. 27, a power device 160 of this embodiment may be configured to include four switching elements 164 and four diodes 166, as described above. A surface of the power device 160 may be divided into a first zone 171 having a relatively high surface temperature band and a second zone 172 having a relatively low surface temperature band when operating. More specifically, the surface of the power device 160 maintains a high temperature in the first zone 171 on which the switching elements 164 with a relatively large amount of heat are disposed, and maintains a low temperature in the second zone 172 on which the diodes 166 with a relatively small amount of heat are disposed.

In consideration of this, as illustrated in FIG. 28, cooling fins 188b disposed to correspond to the first zone 171 and the second zone 172 may be provided on the surface of the power device 160.

The cooling fins 188b may include first cooling fins 189 disposed in the first zone 171 having a relatively large amount of heat, and second cooling fins 190 disposed in the second zone 172 having a relatively small amount of heat. The number of the first cooling fins 189 may be greater than the number of the second cooling fins 190. Accordingly, an amount of heat exchange in the first zone 171 having the relatively large amount of heat may be increased, so that the surface temperature in the first zone 171 may be further (greatly) reduced.

In addition, the cooling fins in the first zone 171 having the relatively large amount of heat may be disposed closer to each other compared to the cooling fins in a zone having a relatively small amount of heat, on the power device 160. Accordingly, a distance W1 between the first cooling fins 189 is smaller than a distance W2 between the second cooling fins 190, resulting in accelerating a flow rate of a cooling fluid L flowing between the first cooling fins 189 beyond a flow rate of a cooling fluid L flowing between the second cooling fins 190, so that a heat exchange amount of the first cooling fins 189 may be increased.

Meanwhile, as illustrated in FIG. 29, cooling fins 188c of the power device 160 may have a relatively short length and may be configured in a larger number per unit area. In this embodiment, the distance W1 between the first cooling fins 191 disposed in the first zone 171 may be configured smaller than the distance W2 between the second cooling fins 192 disposed in the second zone 172. Accordingly, an amount of cooling in the first zone 171 is increased, and the temperature of the first zone 171 can be further reduced. The number of first cooling fins 191 disposed in the first zone 171 may be greater than the number of second cooling fins 192 disposed in the second zone 172. Accordingly, the amount of heat exchange in the first zone 171 may be relatively increased.

In addition, as illustrated in FIG. 30, cooling fins 188d of the power device 160 may be configured to have a rod shape with a circular cross section. In this embodiment, the number of first cooling fins 193 disposed in the first zone 171 may be greater than the number of second cooling fins 194 disposed in the second zone 172. Accordingly, the surface temperature in the first zone 171 may be further (greatly) lowered than the surface temperature in the second zone 172.

According to this configuration, when the inverter apparatus is operated, a direct current power source provided from the battery of the vehicle may be inputted to the DC link capacitor 390, and the direct current power source provided from the DC link capacitor 390 is the power device 160 may be inputted to the circuit element assembly 162 through the input terminal 182 of the power device 160. When the inverter apparatus is operated, a temperature of the power device 160 and a temperature of the gate board 400 may be respectively increased by a heating action.

Inside the housing 200, a cooling fluid L may be introduced in from the flow path of the cooling fluid. The cooling fluid L introduced into the housing 200 may cool the power device 160 while moving along the lower flow path 206 and the upper flow path 207, respectively. The cooling fluid L in the housing 200 directly contacts the surface of the power device 160 to directly cool the power device 160, and at the same time, the cooling fluid L is brought into contact with the cooling fins 188 to exchange heat. Therefore, the power device 160 is quickly cooled.

Meanwhile, the gate board 400 controls the circuit elements to convert the frequency, and the control board 450 controls a switching waveform to output an alternative current power source converted to a desired frequency through the output terminal 184. Accordingly, the alternative current power source of the desired frequency is applied to the motor through the output cable connected to the output terminal 184, and the motor can be rotated at a desired rotational speed.

In the above, it has been illustrated and described with respect to specific embodiments of the present disclosure. However, the present disclosure may be implemented in various forms within a range not departing from its idea or essential features, and thus the above-described embodiments should not be limited by the content of the detailed description.

In addition, even if the embodiments are not listed individually in the detailed description described above, it should be broadly interpreted within the scope of the technical idea defined in the appended claims. In addition, all changes and modifications included within the technical scope of the claims and their equivalents should be covered by the appended claims.

The invention claimed is:

1. A power module comprising:
a power device configured to convert a frequency of an input power and to output an output power having the converted frequency; and
a housing that accommodates the power device therein and defines flow paths configured to guide a cooling fluid along and in contact with surfaces of the power device,
wherein the power device comprises:
a circuit element assembly comprising a circuit that includes a plurality of circuit elements having a plurality of terminals, and
a coating layer that surrounds a periphery of the circuit element assembly, and
wherein end portions of the plurality of terminals are disposed outside the coating layer and the housing.

2. The power module of claim 1, wherein the plurality of terminals comprise:
an input terminal that protrudes outward of a first side of the housing; and
an output terminal that protrudes outward of a second side of the housing opposite to the first side.

3. The power module of claim 1, wherein the power device includes a plurality of zones configured to have different temperature ranges from one another,
wherein the power device further comprises cooling fins that are connected to the circuit element assembly and protrude outward of the coating layer, the cooling fins being configured to contact the cooling fluid and exchange heat with the cooling fluid, and
wherein a number of the cooling fins disposed in a zone among the plurality of zones is determined based on an amount of heat from the zone relative to heat from another zone among the plurality of zones.

4. The power module of claim 1, wherein the power device includes a plurality of zones configured to have different temperature ranges from one another,
wherein the power device further comprises cooling fins that are connected to the circuit element assembly and protrude outward of the coating layer, the cooling fins being configured to contact the cooling fluid and exchange heat with the cooling fluid,
wherein the cooling fins comprise:
first cooling fins disposed at a first zone among the plurality of zones, the first zone being configured to have a first temperature, and
second cooling fins disposed at a second zone among the plurality of zones, the second zone being configured to have a second temperature less than the first temperature, and
wherein the first cooling fins are spaced apart from one another by a first distance, and the second cooling fins are spaced apart from one another by a second distance greater than the first distance such that a flow rate of the cooling fluid in the first zone is greater than a flow rate of the cooling fluid in the second zone.

5. The power module of claim 1, wherein the plurality of terminals comprise communication pins that are connected to the circuit element assembly and protrude to the outside of the housing, and
wherein the communication pins are connected to a gate board of an inverter apparatus including the power module, the gate board comprising a control circuit configured to control the input power of the power device.

6. The power module of claim 5, wherein the housing comprises:
a first housing that defines a least a portion of an accommodating space receiving the power device, the first housing having an upper opening that faces the accommodating space; and
a second housing that is coupled to the first housing and blocks the upper opening of the first housing, and
wherein the second housing comprises a high-temperature element contact portion that is in contact with a high-temperature element of the gate board and that is configured to exchange heat with the high-temperature element.

7. The power module of claim 6, wherein each of the second housing and the high-temperature element contact portion is made of metal,
wherein the high-temperature element comprises a plurality of high-temperature elements having different heights from one another, and
wherein the high-temperature element contact portion comprises a plurality of high-temperature element contact portions having different heights from one another, each of the plurality of high-temperature element contact portions facing and contacting one of the plurality of high-temperature elements.

8. The power module of claim 6, wherein the first housing and the second housing comprise engaging portions that are coupled to and contact each other in a thickness direction of the housing, and
wherein each of the engaging portions comprises:
a coupling protrusion that protrudes in the thickness direction from one of the first housing and the second housing; and
a coupling portion coupled to the coupling protrusion and disposed at the other of the first housing and the second housing.

9. The power module of claim 6, wherein the housing defines an inlet portion configured to receive the cooling fluid and an outlet portion configured to discharge the cooling fluid.

10. The power module of claim 9, wherein the inlet portion is defined at a first end portion in a lengthwise direction of the housing, and the outlet portion is defined at a second end portion in the lengthwise direction of the housing.

11. The power module of claim 9, wherein the housing comprises:
   a first protrusion that protrudes from a first end portion of the housing and extends in a first direction oblique relative to a lengthwise direction of the housing, the first protrusion defining the inlet portion and being connected to one of the flow paths;
   a second protrusion that protrudes from the first end portion of the housing and extends in a second direction oblique relative to the lengthwise direction of the housing, the second protrusion defining the outlet portion and being connected to another of the flow paths; and
   a communication portion that is defined at a second end portion of the housing and connects the flow paths to each other.

12. The power module of claim 9, wherein the housing comprises a partition portion that divides an inner space of the housing.

13. A method for manufacturing a power module, the method comprising:
   providing a power device configured to convert a frequency of an input power and to output an output power having the converted frequency; and
   providing a housing configured to accommodate the power device therein and to define flow paths that are configured to guide a cooling fluid along and in contact with surfaces of the power device,
   wherein providing the power device comprises:
      connecting a plurality of circuit elements including a plurality of terminals, and
      applying a coating layer that surrounds at least a portion of a circuit element assembly including the plurality of circuit elements, and
   wherein end portions of the plurality of terminals are disposed outside the coating layer and the housing.

14. The method of claim 13, wherein providing the housing comprises:
   providing a first housing configured to define at least a portion of an accommodating space receiving the power device, the first housing having an upper opening that faces the accommodating space; and
   coupling a second housing to the first housing to block the upper opening of the first housing.

15. The method of claim 14, further comprising:
   based on coupling the second housing to the first housing, connecting a gate board to the housing, the gate board comprising a control circuit configured to control the input power of the power device, and high-temperature elements configured to discharge heat,
   wherein providing the first housing comprises:
      before connecting the gate board to the housing, forming high-temperature element contact portions that are disposed at the second housing and configured to contact the high-temperature elements of the gate board, and
   wherein connecting the gate board to the housing comprises arranging the gate board and the housing such that the high-temperature element contact portions and the high-temperature elements are brought into contact with each other.

16. An inverter apparatus comprising:
   a case;
   a power module disposed inside the case, the power module comprising:
      a power device configured to convert a frequency of an input power and to output an output power having the converted frequency, and
      a housing that accommodates the power device therein and defines flow paths configured to guide a cooling fluid along and in contact with surfaces of the power device; and
   a direct current (DC) link capacitor disposed inside the case and configured to provide DC power to the power module,
   wherein the power device further comprises:
      a circuit element assembly comprising a circuit that includes a plurality of circuit elements having a plurality of terminals,
      a coating layer that surrounds a periphery of the circuit element assembly, and
      a plurality of cooling fins that are connected to the circuit element assembly and protrude outward of the coating layer, and
   wherein the plurality of terminals comprise:
      input terminals that are connected to the circuit element assembly, that protrude outward of a first side of the housing, and that are connected to the DC link capacitor, and
      output terminals that protrude outward of a second side opposite to the first side of the housing.

17. The inverter apparatus of claim 16, wherein the plurality of terminals further comprise communication pins that are disposed outside the housing and extend upward relative to the power device, and
   wherein the inverter apparatus further comprises:
      a gate board connected to the communication pins, the gate board comprising a control circuit configured to control the input power of the power device,
      a control board connected to the gate board and configured to control a switching waveform of the power device, and
      an insulating member disposed between the gate board and the case or between the control board and the case, and
   wherein the gate board comprises one or more high-temperature elements that contact the housing.

* * * * *